United States Patent
Rodney et al.

(10) Patent No.: US 10,280,739 B2
(45) Date of Patent: May 7, 2019

(54) DOWNHOLE CLOCK CALIBRATION APPARATUS, SYSTEMS, AND METHODS

(71) Applicant: Halliburton Energy Services, Inc., Houston, TX (US)

(72) Inventors: Paul F. Rodney, Spring, TX (US); Paul Andrew Cooper, Humble, TX (US)

(73) Assignee: Halliburton Energy Services, Inc., Houston, TX (US)

(*) Notice: Subject to any disclaimer, the term of this patent is extended or adjusted under 35 U.S.C. 154(b) by 93 days.

(21) Appl. No.: 15/302,095

(22) PCT Filed: Dec. 5, 2014

(86) PCT No.: PCT/US2014/068773
§ 371 (c)(1),
(2) Date: Oct. 5, 2016

(87) PCT Pub. No.: WO2016/089420
PCT Pub. Date: Jun. 9, 2016

(65) Prior Publication Data
US 2017/0211375 A1    Jul. 27, 2017

(51) Int. Cl.
*E21B 47/12* (2012.01)
*G01V 1/26* (2006.01)
(Continued)

(52) U.S. Cl.
CPC ............ *E21B 47/12* (2013.01); *E21B 47/00* (2013.01); *E21B 47/01* (2013.01); *G01V 1/26* (2013.01);
(Continued)

(58) Field of Classification Search
CPC .......... G04D 7/00; G04D 7/003; E21B 47/01; E21B 47/12; G01V 2200/00; H03B 5/02; H03B 5/32
(Continued)

(56) References Cited

U.S. PATENT DOCUMENTS

| | | | |
|---|---|---|---|
| 3,820,063 A | 6/1974 | Sexton et al. | |
| 3,821,696 A | 6/1974 | Harrell et al. | |

(Continued)

FOREIGN PATENT DOCUMENTS

| | | |
|---|---|---|
| CN | 201137488 Y | 10/2008 |
| CN | 101676517 A | 3/2010 |

(Continued)

OTHER PUBLICATIONS

Canadian Application Serial No. 2,966,729, Canadian First Examiner's Letter, dated Mar. 14, 2018, 3 pages.

(Continued)

*Primary Examiner* — Arnold Kinkead
(74) *Attorney, Agent, or Firm* — Gilliam IP PLLC

(57) ABSTRACT

In some embodiments, an apparatus and a system, as well as a method and an article, may operate to receive a derived clock signal downhole, the derived clock signal being derived from a surface clock signal (associated with a surface clock), such that the frequency of the derived clock signal is less than the frequency of the surface clock signal. Further activity may include measuring the frequency of the derived clock signal in terms of an uncorrected downhole clock frequency (associated with a downhole clock) to provide a measured frequency equivalent, and correcting time measurements made using the downhole clock, based on the measured frequency equivalent, or based on an actual frequency of the downhole clock determined according to the measured frequency equivalent. Additional apparatus, systems, and methods are described.

23 Claims, 11 Drawing Sheets

(51) Int. Cl.
  *E21B 47/00* (2012.01)
  *E21B 47/01* (2012.01)
  *G04D 7/00* (2006.01)
  *H03B 5/02* (2006.01)
  *H03B 5/32* (2006.01)

(52) U.S. Cl.
  CPC .............. *G04D 7/003* (2013.01); *H03B 5/02* (2013.01); *G01V 2200/12* (2013.01); *H03B 5/32* (2013.01)

(58) Field of Classification Search
  USPC ........ 331/167, 44; 455/255, 258; 340/853.1, 340/855.3, 854.5; 175/45, 50; 367/27, 367/55
  See application file for complete search history.

(56) References Cited

U.S. PATENT DOCUMENTS

| | | | |
|---|---|---|---|
| 3,886,495 | A | 5/1975 | Sexton et al. |
| 4,001,775 | A | 1/1977 | Sexton et al. |
| 4,136,327 | A | 1/1979 | Flanders et al. |
| 4,166,979 | A | 9/1979 | Waggener |
| 4,284,979 | A | 8/1981 | Flanders et al. |
| 4,320,473 | A | 3/1982 | Smither et al. |
| 4,590,593 | A | 5/1986 | Rodney |
| 5,343,152 | A | 8/1994 | Kuckes |
| 5,594,343 | A | 1/1997 | Clark et al. |
| 5,899,958 | A | 5/1999 | Dowell et al. |
| 5,900,059 | A | 5/1999 | Shimanuki et al. |
| 5,924,499 | A | 7/1999 | Birchak |
| 5,963,036 | A | 10/1999 | Wu et al. |
| 6,023,444 | A | 2/2000 | Naville et al. |
| 6,308,137 | B1 | 10/2001 | Underhill et al. |
| 6,341,498 | B1 | 1/2002 | DiFoggio |
| 6,400,646 | B1 | 6/2002 | Shah et al. |
| 6,424,595 | B1 | 7/2002 | Chenin |
| 6,439,046 | B1 | 8/2002 | Kruspe et al. |
| 6,606,009 | B2 | 8/2003 | Gunawardana et al. |
| 6,614,718 | B2 | 9/2003 | Cecconi et al. |
| 6,618,674 | B2 | 9/2003 | Ireland et al. |
| 6,630,890 | B1 | 10/2003 | Endo et al. |
| 6,837,105 | B1 | 1/2005 | DiFoggio et al. |
| 6,912,465 | B2 | 6/2005 | Collins et al. |
| 6,920,085 | B2 | 7/2005 | Finke et al. |
| 7,011,152 | B2 | 3/2006 | Soelvik |
| 7,046,584 | B2 | 5/2006 | Sorrells et al. |
| 7,116,192 | B2 | 10/2006 | Ishizuya et al. |
| 7,135,933 | B2 | 11/2006 | Bartholomew |
| 7,142,129 | B2 | 11/2006 | Hall et al. |
| 7,212,075 | B2 | 5/2007 | Young et al. |
| 7,230,543 | B2 | 6/2007 | Minto et al. |
| 7,253,671 | B2 | 8/2007 | Hall et al. |
| 7,551,516 | B2 | 6/2009 | Harmon |
| 7,668,041 | B2 | 2/2010 | Fanini et al. |
| 7,912,647 | B2 | 3/2011 | DiFoggio |
| 7,969,819 | B2 | 6/2011 | Hall et al. |
| 7,982,550 | B1 | 7/2011 | Quevy et al. |
| 8,069,932 | B2 | 12/2011 | Kamata |
| 8,107,317 | B2 | 1/2012 | Underhill et al. |
| 8,181,057 | B2 | 5/2012 | Nichols et al. |
| 8,195,397 | B2 | 6/2012 | Blanz |
| 8,378,839 | B2 | 2/2013 | Montgomery et al. |
| 8,514,098 | B2 | 8/2013 | Montgomery et al. |
| 8,605,543 | B2 | 12/2013 | Ray et al. |
| 8,634,273 | B2 | 1/2014 | Gardner et al. |
| 8,686,806 | B2 | 4/2014 | Quevy et al. |
| 8,731,837 | B2 | 5/2014 | Mehta et al. |
| 2005/0022987 | A1* | 2/2005 | Green .................... E21B 23/04 166/250.17 |
| 2005/0132246 | A1 | 6/2005 | Schmalz et al. |
| 2006/0180349 | A1 | 8/2006 | Dashevskiy |
| 2006/0221768 | A1* | 10/2006 | Hall ........................ G01V 1/40 367/82 |
| 2007/0189119 | A1 | 8/2007 | Klotz et al. |
| 2008/0137474 | A1 | 6/2008 | Dashevskiy et al. |
| 2008/0189044 | A1 | 8/2008 | Chamberlain et al. |
| 2008/0217057 | A1 | 9/2008 | Hall et al. |
| 2009/0195408 | A1 | 8/2009 | Patterson et al. |
| 2009/0235732 | A1 | 9/2009 | Difoggio |
| 2010/0039286 | A1 | 2/2010 | Robbins |
| 2010/0322030 | A1 | 12/2010 | Coman et al. |
| 2011/0026362 | A1 | 2/2011 | Tang et al. |
| 2011/0141850 | A1 | 6/2011 | Scott et al. |
| 2011/0251813 | A1 | 10/2011 | Coman et al. |
| 2011/0286308 | A1 | 11/2011 | Sugiura |
| 2011/0286309 | A1 | 11/2011 | Sugiura |
| 2012/0163523 | A1 | 6/2012 | Tang et al. |
| 2012/0314539 | A1 | 12/2012 | Coman |
| 2013/0057511 | A1 | 3/2013 | Shepelev et al. |
| 2013/0066557 | A1 | 3/2013 | Forgang |
| 2013/0154844 | A1 | 6/2013 | Montgomery |
| 2013/0194892 | A1 | 8/2013 | Golparian et al. |
| 2013/0213714 | A1 | 8/2013 | Fulda |
| 2014/0142855 | A1 | 5/2014 | Liu et al. |
| 2014/0354446 | A1* | 12/2014 | Nakayama .............. E21B 47/12 340/854.9 |

FOREIGN PATENT DOCUMENTS

| | | |
|---|---|---|
| CN | 201486545 U | 5/2010 |
| CN | 202441366 U | 9/2012 |
| JP | 0423534 A | 1/1992 |
| NO | 823369 A | 5/1983 |
| NO | 823380 A | 5/1983 |
| RU | 1796014 A3 | 2/1993 |
| SU | 1615350 A1 | 12/1990 |
| WO | WO-9411763 A1 | 5/1994 |
| WO | WO-0077345 A1 | 12/2000 |
| WO | WO-2005028811 A1 | 3/2005 |
| WO | WO-2012064610 A2 | 5/2012 |
| WO | WO-2012118891 A2 | 11/2012 |
| WO | WO-2013101569 A1 | 7/2013 |
| WO | WO-2016089420 A1 | 6/2016 |

OTHER PUBLICATIONS

Australian Examination Report Application No. 2014412808, dated Nov. 13, 2017, 3 pgs.

"International Application Serial No. PCT/US2014/068773, International Preliminary Report on Patentability, dated Jun. 15, 2017", 15 pgs.

"International Application Serial No. PCT/US2014/068773, International Search Report dated Aug. 3, 2015", 3 pgs.

"International Application Serial No. PCT/US2014/068773, Written Opinion dated Aug. 3, 2015", 13 pgs.

"Time Domain Oscillator Stability Measurement—Allan variance", Rohde & Schwarz GmbH & Co., [Online]. Retrieved from the Internet: <URL: http://cdn.rohde-schwarz.com/dl_downloads/dl_application/application_notes/1ef69/1EF69_E3.pdf>, (2009), 16 pgs.

Althoff, Gary, et al., "New Concepts for Seismic Surveys While Drilling", SPE Annual Technical Conference and Exhibition, Sep. 26-29, Houston, Texas, SPE-90751-MS, (2004), 1-12.

Freudenthal, Tim, et al., "Scientific Drilling with the Sea Floor Drill Rig MeB", Scientific Drilling, 5, (Sep. 2007), 63-66.

Giordano, V., et al., "New advances in ultra-stable microwave oscillators", Eur. Phys. J. Appl. Phys., 32, (2005), 133-141.

Landro, Marin, et al., "Marine Seismic Sources: part I: air-guns for non experts", Geo ExPro, 7(1), (2010), 32-34.

Lockridge, Jeff, et al., "Magnetotellurics", [Online]. Retrieved from the Internet: <URL: http://earthscope-sem.asu.edu/Lecture_Discussion/03_MT/Magnetotellurics.pdf>, (Feb. 16, 2010), 14 pgs.

Orange, A. S, "Magnetotelluric exploration for hydrocarbons", Proceedings of the IEEE, 77(2), (Feb. 1989), 287-317.

Tulone, Daniela, "On the Feasibility of Time Estimation under Isolation Conditions in Wireless Sensor Networks", Algorithmica, 49(4), (Dec. 2007), 386-411.

Yang, Y., et al., "A bi-directional fixed-latency clock distribution system", Nuclear Instruments and Methods in Physics Research

(56) References Cited

OTHER PUBLICATIONS

Section A: Accelerators, Spectrometers, Detectors and Associated Equipment, 732, (Dec. 21, 2013), 497-500.
Yang, Y., et al., "Research of a long distance clock distribution", Journal of Instrumentation, 8, (Mar. 2013), 1-9.
Russian Application Serial No. 2017115680; First Office Action; dated Aug. 8, 2018, 5 pages.

* cited by examiner

US 10,280,739 B2

DOWNHOLE CLOCK CALIBRATION APPARATUS, SYSTEMS, AND METHODS

PRIORITY APPLICATIONS

This application is a U.S. National Stage Filing under 35 U.S.C. § 371 from International Application No. PCT/US2014/068773, filed on 5 Dec. 2014, and published as WO 2016/089420 on 9 Jun. 2016, which application and publication are incorporated herein by reference in their entirety.

BACKGROUND

Understanding the structure and properties of geological formations can reduce the cost of drilling wells for oil and gas exploration. Measurements made in a borehole (i.e., down hole measurements) are typically performed to attain this understanding, to identify the composition and distribution of material that surrounds the measurement device down hole. To obtain such measurements, a variety of sensors and mounting configurations are used.

For example, Logging While Drilling/Measurement While Drilling (LWD/MWD) electromagnetic (EM) logging tools can be used as a mounting platform for downhole sensors. Some projects make use of timing signals provided by clocks located downhole, where an accuracy of about one part in a billion (1 in $10^9$) is useful. However, this order of accuracy is difficult, and in some cases impossible to achieve using conventional techniques.

DETAILED DESCRIPTION

To address some of the challenges described above, as well as others, apparatus, systems, and methods are described herein that may operate to increase the accuracy of clocks that operate downhole. Some embodiments provide a solution by making it possible to calibrate the frequency of the downhole clock master oscillator in situ.

For example, this result can be achieved by providing a clock at the Earth's surface that is significantly more stable than what is desired downhole, and deriving a low frequency signal from the master oscillator of the surface clock (e.g., on the order of 1 Hz). A signal is then transmitted downhole via an electromagnetic downlink at the low frequency, received downhole, where the frequency of the downlinked signal is measured in terms of downhole clock time units. At that point, the actual frequency of the downhole clock at the time the downlinked signal was received is calculated, and used to correct the times derived from the downhole clock by taking into account the measured frequency shift.

The following paragraphs will set forth at least two mechanisms for measuring the frequency of the downlinked signal, and at least one technique for correcting times derived from the downhole clock.

Figure 1:
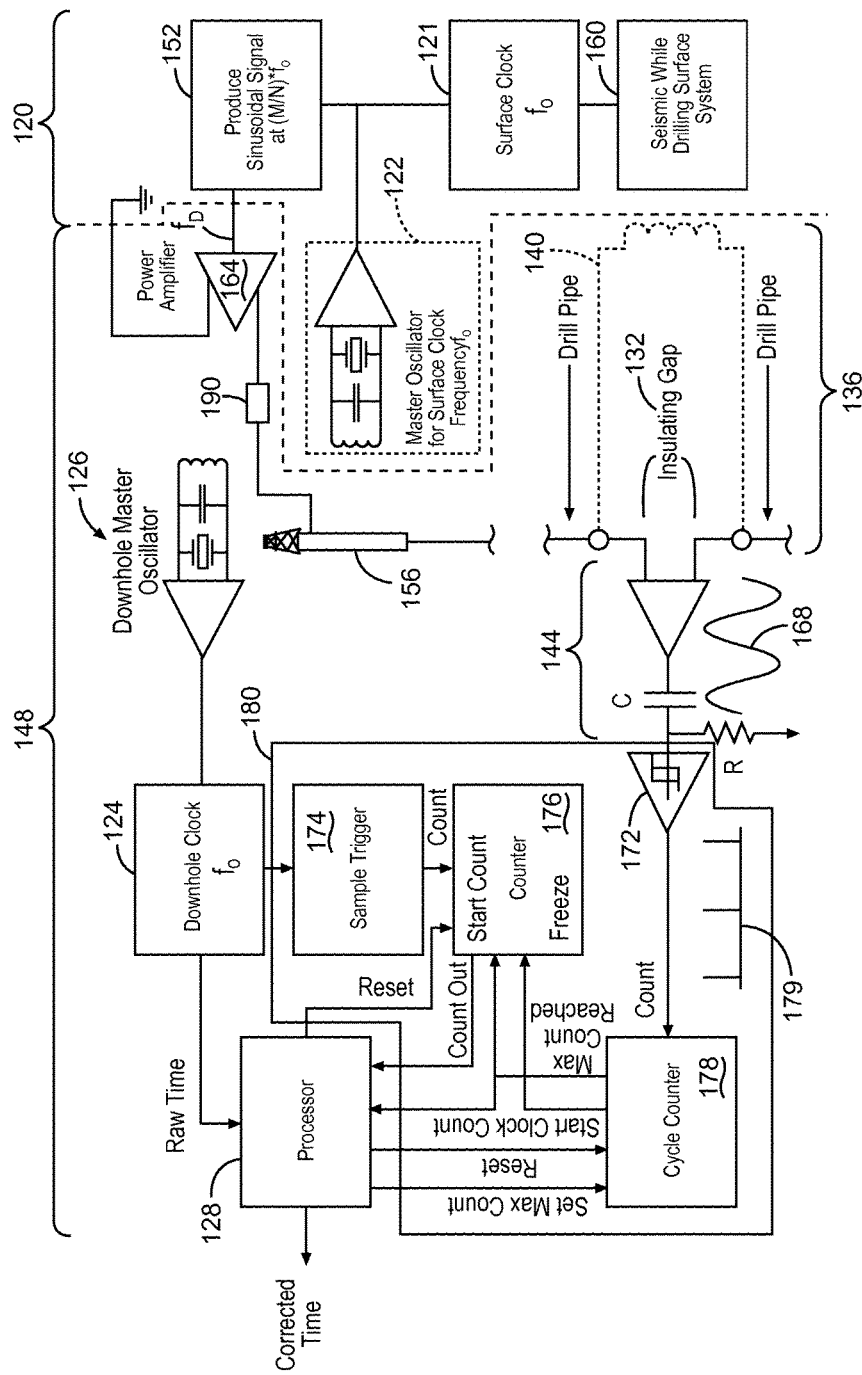
FIG. 1 is a block diagram of apparatus and systems according to various embodiments of the invention.
Figure 2:
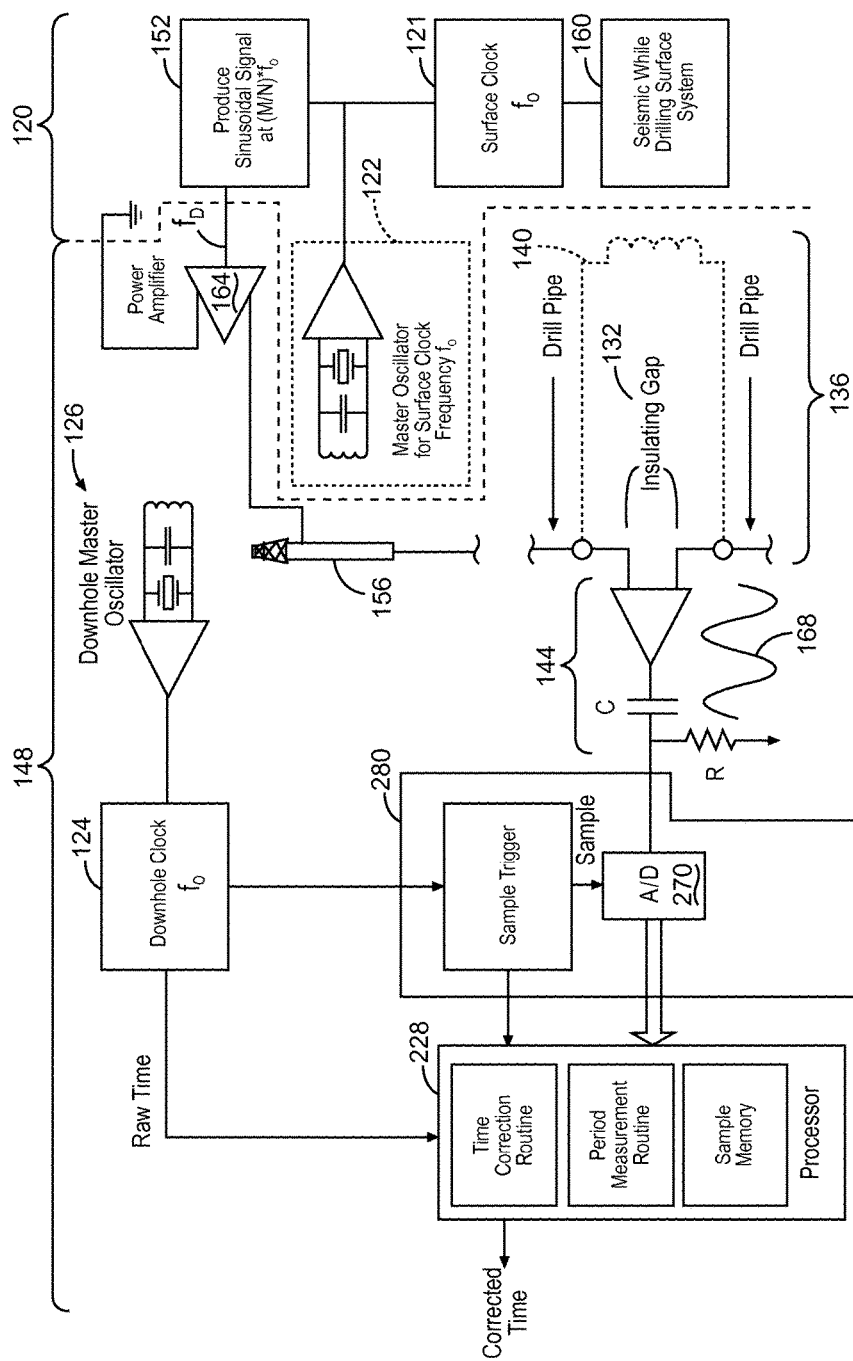
FIG. 2 is a block diagram of apparatus and systems according to various embodiments of the invention.

To begin, reference is now made to FIGS. 1 and 2, where multiple embodiments of apparatus and systems are shown. There are several common features illustrated in the figures.

The surface systems 120 are similar, and in some embodiments, identical, including a surface clock 121, perhaps driven by a master oscillator 122. A downhole clock 124 (perhaps driven by a master oscillator 126), a processor 128, and a reception element 136 (e.g., an insulating gap 132 or coil 140) are located downhole. This downhole apparatus 148 may form part of a seismic while drilling tool 156 (or some other tool in a drill string or wireline sonde). A receiver 144 may be coupled to the reception element 136, such as the insulating gap 132. The stability of the clocks 121, 124 may vary with application and mission life, but in many embodiments, the surface clock 121 should be at least an order of magnitude more stable than the downhole clock 124.

If the downhole clock 124 cannot be periodically resynchronized against the surface clock 121, then the downhole clock 124 should at least meet the overall system specification and the surface system 120 should exceed the overall system specification, lest the combined drift of the two clocks 121, 124 exceed the desired specification for stability.

For example, for a drift of no more than 1 msec over a mission life of 200 hours, the downhole clock 124 should not drift by more than one part in $10^9$, while the surface clock 121 drift rate should be roughly an order of magnitude less. On the other hand, if resynchronization between the clocks 121, 124 can be achieved at discrete times during the mission, the stability requirement can be relaxed, depending on the number of times it can be resynchronized.

The surface system 120, as shown, includes a surface clock 121 that is part of a seismic while drilling system 160. The clock 121 is shown separately in order to highlight its derivation from a stable master oscillator 122. As is known to those of ordinary skill in the art, such oscillators are discussed in "New Advances in Ultra-Stable Microwave Oscillators," V. Giordano, P. Y. Borgeouis, Y. Gruson, N. Boubekour, R. Boudot, E. Rubiola, N. Bazin, and Y. Kersalé, Eur. Phys. J. Appl. Phys., 32, 133-141 (2005), as well as in other references.

The surface clock master oscillator 122 is shown for simplicity as a crystal oscillator, but as discussed in Giordano et al, a number of other oscillatory systems can be used. A separate derivation circuit 152 is used to derive a stable low frequency signal from the master oscillator 122. Thus, if the master oscillator 122 operates at a frequency of $f_0$, then the derived signal $f_D$ might be produced at a frequency of $(M/N)*f_0$, where M and N are integers.

Thus, in some embodiments, the derived signal $f_D$ could be provided by dividing down the frequency $f_0$ of the master oscillator 122 by a large integer N and possibly also multiplying it by some integer M so as to produce a signal with the same stability as that of the master oscillator, but at a much lower frequency (e.g., in the range of 0.1 Hz to 100

Hz). Circuits of this kind are well known to those of ordinary skill in the art (e.g., division can be carried out using a system of counters, while multiplication can be carried out by choosing harmonics of a square wave or using logic circuits and delay elements).

The output of the derivation circuit 152 might be substantially a sine wave, with some amount of harmonic distortion permitted. The output of this circuit 152 is passed to a power amplifier 164 with a differential output.

One leg of the output from the power amplifier 164 drives a conductor that is connected to the casing of the well containing the seismic while drilling tool 156. The other leg is connected to a ground post at a remote location from the casing that is connected to the first leg (this may be the casing of another well, for example). In this way, a signal is launched onto the casing, and from there, onto the bottom hole assembly (BHA). This signal has the same stability as the master oscillator 122 in the surface system 120, and will be referred to as the reference signal 168.

The downhole clock 124 in FIGS. 1 and 2 is derived from a downhole master oscillator 126, again shown for simplicity as a crystal oscillator in each figure. The apparatus 148 in FIGS. 1 and 2 also both have an insulating gap 132 that is part of the drill string, and in particular, as part of the BHA in the seismic while drilling system.

The insulating gap 132 serves as a reception element for the reference signal 168, and is shown connected to an amplifier, as a receiver 144. Alternatively, a coil 140, perhaps in the form of a toroid, can be constructed around the drill collar and used to receive the downlinked reference signal 168.

The apparatus of FIGS. 1 and 2 also have processors 128, 228 (e.g., digital signal processors or downhole processing units). These processors 128, 228 carry out somewhat different functions in the figures.

Referring now to FIG. 1, it can be seen that the reference signal 168, perhaps corrupted by noise, is received via a potential difference induced across the insulating gap 132 or via a voltage induced in the aforementioned coil 140. This signal 168 is amplified, and perhaps filtered. A simple resistor-capacitor (RC) filter is shown in the receiver 144, although more complex filters (e.g., narrow band) could be used to reject noise.

A Schmitt trigger 172 is connected to the output of this filter. The Schmitt trigger 172 produces a positive pulse every time the filtered signal swings from a negative voltage to a positive voltage. This results a series of pulses 179, all nominally separated by the period of the reference pulse. The downhole clock 124 (or the downhole master oscillator 126) is used to drive a trigger circuit 174 that is used to cause a counter 176 to increment at a rate that is tied to the master oscillator frequency (e.g., this rate may in fact be the same as the rate of the master oscillator). Once the signal 168 is acquired, its frequency can be measured as described in the following paragraphs.

A counter 178 is provided for counting the number of times the Schmitt trigger is fired. This counter 178 can be reset, and provides an output pulse simultaneous with the first pulse entered into the counter 178 after it has been reset. In addition, the counter 178 is designed so as to provide a "freeze" pulse simultaneous with achieving a full count as specified by the downhole processor.

The measurement cycle begins by the downhole processor 128 setting a maximum count value in the counter 178 associated with the Schmitt trigger 172. This value is used to set the number of cycles of the reference signal 168 that are used in the measurement of the frequency of the master oscillator 126.

After the maximum count value is set up, the downhole processor 128 resets the counter 178 associated with the Schmitt trigger 172, and the counter 176 associated with the downhole master oscillator 126.

Upon receipt of the next pulse from the Schmitt trigger 172, the counter 178 associated with the Schmitt trigger 172 issues a pulse that enables counting in the counter 176 associated with the master oscillator 126.

The master oscillator 126 continues to generate counts in the counter 176 until a full count (i.e., the maximum value set by the processor 128) is achieved in the counter 178 associated with the Schmitt trigger 172, at which time, the Schmitt trigger 172 sends a signal that freezes the count in the counter 176 associated with the master oscillator 126. The same signal is also provided to the downhole processor 128 to inform the processor 128 that the measurement cycle has been completed.

After this, the processor 128 reads the count in the counter 176 associated with the master oscillator 126. As will be described later, this count will be converted into an apparent frequency of the reference signal 168. From the apparent frequency of the reference signal 168, the actual frequency of the downhole master oscillator 126 can be determined.

As will be described later, once the actual frequency of the downhole master oscillator 126 has been determined, a correction (or a series of corrections) can be made to the timing values derived from the downhole master oscillator 126, as used to measure the occurrence of events downhole.

Generally, the accuracy of measuring the apparent frequency of the reference signal 168 will increase as the number of Schmitt trigger counts increases. This is because the timing uncertainty of zero crossings is substantially constant during the measurement period, and because the timing uncertainty is not cumulative from zero crossing to zero crossing, but instead applies only at the beginning and end of the sequence of zero crossings used in the measurement cycle.

Referring now to FIG. 2, a variation in the apparatus shown in FIG. 1 is shown, which can also be used to determine the frequency of the downhole master oscillator 126 and for correcting the downhole clock 124.

Here the reference signal 168 is received, amplified and filtered as in FIG. 1. However, in this case the filtered signal is sampled using an analog-to-digital converter 270. The frequency at which the analog-to-digital converter 270 is sampled can be tied to the frequency of the downhole master oscillator 126, and in the embodiment shown is at the same frequency as the oscillation frequency $f_0$ of the downhole master oscillator 126. The values sampled by the analog-to-digital converter are read by the downhole processor 228 and stored in a sample memory. After a pre-determined number of samples have been stored, the downhole processor 228 analyzes the data in memory and provides an estimate of the frequency of the reference signal 168. Since the frequency of the reference signal 168 is known, the measured frequency of the reference signal 168 can now be used to correct the frequency of the downhole master oscillator 126.

Note that the downhole processor 228 can be programmed to continue acquiring data from the analog-to-digital converter 270 while it is processing data already in the sample memory. This makes it possible not only to measure the frequency of the downhole master oscillator 126 but to provide an ongoing analysis of the time variation of that frequency and of the uncertainty of measurement. This can be effected via an analysis of the Allan Variance in some embodiments. The resulting information can be useful for diagnostics and for estimating the trend in the frequency of the downhole master oscillator 126.

While drift in the frequency of the surface system 120 master oscillator 122 will be discussed later, it will be ignored in the next few paragraphs for reasons of clarity, so that the concepts involved in measuring the period of the reference signal 168 downhole will be more easily understood. As part of this more fundamental discussion, several terms will be introduced to describe how timing downhole is corrected once the downhole master oscillator frequency has been measured. Hence, the immediate discussion will begin with an analysis correcting downhole time measurements, assuming that corrections to the downhole master oscillator frequency have already been made.

For purposes of clarity, it is assumed that a noisy version of the reference signal 168 is digitized (e.g., per FIG. 2) and a curve fitting routine is used to estimate the location of zero crossings of the signal 168, and more generally, determining the period of the reference signal 168 with respect to time units of the downhole clock 124. The result will be used to estimate the frequency of the downhole clock 124 to correct downhole time measurements.

Let the symbol t designate time in the surface system 120 as determined by the surface clock 121. Instants of this time will be designated by $t_i$. Without loss of generality, assume that one "tick" of the surface clock 121 occurs with a period equal to one period of the surface clock's master oscillator 122. Also assume that the master clock and downhole clock oscillators 122, 126 are close in frequency. That is, they are both running at a frequency of approximately $f_0$. While this is not necessarily the case in some embodiments, it simplifies the analysis we now undertake.

Let the symbol "u" designate time in the downhole unit as determined by the downhole clock 124. Instants of this time will be designated by $u_i$. Without loss of generality, assume that one "tick" of the downhole clock 124 occurs with a period equal to one period of the downhole clock's master oscillator 126.

Further assume (this assumption is not strictly needed, but it simplifies the analysis) that $t_0 = u_0 = 0$. That is, that the surface and downhole clocks 121, 124 are synchronized at some time, which is set to 0.

Assume that the surface clock 121 has a frequency $f_0[t]$, which may itself be a function of time, but if so, it varies slowly as a function of time compared to the requirement for overall system timing stability. Ideally, the variation is some constant amount.

Also assume that the downhole clock 124 has a frequency f[u], or g[t]. That is, the frequency of the downhole clock 124 is a function of the downhole clock "ticks," but can also be represented as a function of the surface clock "ticks".

Assume that the downlinked reference signal 168 has a frequency $f_2[t]=a*f_0[t]$ where a=M/N for two integers M and N and M/N<<1. The ratio "a" is not a ratio of integers in some embodiments.

Note that t is a function of absolute time and u is a function of absolute time. Since the surface clock 121 is assumed to be of sufficient quality that its drift can be neglected, it introduces unnecessary complication in the analysis to include variation of the surface clock in the analysis (although it should be noted that some embodiments are constructed to account for instability of the surface clock 121, as will be described later).

To keep the downhole master oscillator frequency synchronized with the frequency of the surface master oscillator 122, it may be useful to know the frequency of the surface master oscillator 122 as a function of time, which may be termed "absolute time" (i.e., time derived from a reliable, stable standard). Hence, the surface clock frequency will simply be designated by $f_0$.

The duration of a "tick" of the surface clock 121 is $Dt=1/f_0$. And the time after i ticks is $t_i=i*Dt$. These conditions imply that $f_0$ can be taken to be a constant. The downhole clock 124 similarly produces a count for every "tick" of its master oscillator and it interprets the time after j ticks as $u_j=j*Dt$.

To understand how the time downhole is related to the time in the surface clock 121, the downhole clock frequency can be characterized as either a function of its own elapsed time since synchronization of the two clocks last occurred, or as a function of the elapsed time at the surface since the synchronization of the two clocks last occurred. Hence, it is intended that t and u be related as f[u]=g[t]. This raises the issue of mapping values of t to corresponding values of u.

Since in some embodiments the master oscillator period is on the order of 100 nsec, while the desired timing accuracy is on the order of 1 msec, the granularity issue will be ignored and it will be assumed that occurrences of the downhole clock 124 executing tick J can be mapped to occurrences of the master clock executing tick I. This will determine a mapping function between the set of values {j} and the set of values {i}.

The time of the surface clock 121 at tick I is $T_I=I*Dt$. The time of the downhole clock 124 at tick J is $u_J=J*Dt$. Thus, the time at tick J of the downhole clock 124 (as measured by the surface clock 121) is given by $$u_{J'} = \sum_{i=1}^{J} \frac{1}{f(u_i)}.$$

It is also the case that $u_{J'}=T_I$ and thus, $$u_{J'} = \sum_{i=1}^{I} \frac{1}{g(t_i)}.$$

To know the correct time downhole, it is sufficient to have an accurate estimate of the series {f[$u_0$], f[$u_1$], f[$u_2$], . . . f[$u_J$]}. Thus, the determination of the frequency of the downhole clock 124 from downhole measurements of the reference signal 168 will now be discussed.

The reference signal 168 is downlinked at a frequency of $\omega_2=2\pi*f_2$, and can be used to create estimates of $f_2$ as a function of j (or of $u_j$). Without loss of generality, the signal generated by the surface clock 121 at the point of transmission has the form $C_i=A*\sin[\omega_2*t_i]$.

After propagation to the downhole receiver 144, the reference signal 168 still has the following form, in surface clock 121 time units:
$P_i=B*\sin[\omega_2*t_i+\phi_i]+e_i$, where B is a function of depth and a linear function of A, and where $\phi_i$ is the phase shift in the reference signal due to propagation at sample time i in surface system time units.

Given the prior assumptions, B should be a slowly varying function of depth and will not be treated as a function of time since its variation is only very weakly coupled to the transform between t and u via estimation of the transform parameters. Estimates of B will be updated frequently in the process.

$e_i$ is a sample of a noise process. If the process is simulated, for generality, $e_i$ could be derived as a sum of several noise processes, perhaps as a sum of processes proportional to: 1/frequency$^2$, 1/frequency, independent of frequency, and frequency. The noise model used may depend on how the received reference signal 168 is filtered.

Now, let $Q_j$ samples of the received synchronizing signal be taken by the analog-to-digital converter 270. Assume that the noise from the converter 270 can be ignored, since circuits with sufficient resolution to justify this assumption can be readily designed. Note that $Q_j$ can be varied depending on the signal to noise ratio. For simplicity, it will be taken to be a constant, but an adaptive routine based on the signal to noise ratio could be designed to optimize the value of $Q_j$ used in the analysis. In some embodiments, $Q_j$ should be sufficiently large to guarantee that at least one full cycle of the downlinked signal is received. The subscripted form is used, $Q_j$ instead of simply Q to emphasize that the frequency will be measured repeatedly over several time intervals.

It is possible to mathematically fit an equation to the series $\{P_i\}$ and hence determine the effective frequency of the reference signal 168 as viewed by the downhole system. For example, a fit of the following form could be carried out using a nonlinear least squares routine: $\hat{P}=\hat{B}*\sin[\omega_3*u+\phi]+\varepsilon$. The general assumption made in writing this expression is that the downhole clock frequency is sufficiently stable during the sample period that it can be taken to be constant. $\hat{B}$ is an estimator of B, $\omega_3$ is an estimator of the reference frequency in units of time "u," $\phi$ is a phase term, and $\varepsilon$ is a noise term.

If the fit is perfect, then the time, u' that it takes to observe one cycle of the reference signal with the downhole clock is given by $u'=(2*\pi)/\omega_3=\omega_3/\omega_2*1/f_2$. Thus, if $\omega_3>\omega_2$, then fewer ticks of the downhole clock 124 have elapsed than would be expected if it were in sync with the surface clock 121. This means that the downhole clock 124 is slow relative to the surface clock 121. It follows from this that $f[u']=f_0*\omega_0*\omega_2/\omega_3$. This is because $\omega_3$ and $\phi$ are known from the regression. Due to cumulative clock drift and propagation effects, $\phi$ cannot be assumed to be 0. $\phi$ may vary slightly during the data acquisition period. However, for the immediate discussion, $\phi$ will be assumed to be constant.

In reality, $u'*\omega_3=2*N*\pi$ for some integer N. The reference frequency is much less than the clock frequency. It is assumed that the downhole clock is good enough so that over any time interval of interest to the system, N=1. This could be remedied by tracking $\phi$, but this is only necessary if a crude downhole clock is used.

Progressively applying the regression technique to downhole samples of the reference signal, a series of clock frequencies can be constructed as being representative of the clock frequency at the centers of the time intervals over which they were measured. This can be fit with a trigonometric series, a low-order polynomial, or other methods discussed more fully later. With some of these methods, the drift of the clock, along with the estimated error in the drift can also be calculated as a function of the downhole time. Hence, the clock readings can be corrected.

The estimators of the samples will be designated by $\hat{P}_i$:

$\hat{P}_i=B*\sin[\omega*u_i+\theta]+\in_i$.

That is, $\hat{P}_i=B*\sin[\omega*i*\Delta t+\theta]+\in_i$.

This form of the expression makes it clear that the frequency $\omega$ is measured relative to the frequency of the surface clock.

Although the most general way of determining the parameters B, $\omega$ and $\theta$ is via a nonlinear least squares technique such as the one available in Matlab, such solutions are helpful mostly for analysis of specific cases and in Monte-Carlo type analyses, but otherwise are not as useful for gaining insight as is a linear solution. Assuming that the frequencies of the two clocks are not radically different, it is possible to linearize this equation.

To this end, consider J given by $$J \equiv \sum_{i=1}^{Q_j} (P_i - B*\text{Sin}[\omega*i*\Delta t + \theta] - \in_i)^2,$$

with the following conditions being assumed:

$$\left(\frac{\partial}{\partial \omega}\right)J = 0,$$

$$\left(\frac{\partial}{\partial \theta}\right)J = 0,$$

$$\left(\frac{\partial}{\partial B}\right)J = 0,$$

$$\sum_{i=1}^{Q_j} i*(P_i - B*\text{Sin}[\omega*i*\Delta t + \theta] - \in_i)*\text{Cos}[\omega*i*\Delta t + \theta] = 0,$$

$$\sum_{i=1}^{Q_j} (P_i - B*\text{Sin}[\omega*i*\Delta t + \theta] - \in_i)*\text{Cos}[\omega*i*\Delta t + \theta] = 0,$$

and $$\sum_{i=1}^{Q_j} (P_i - B*\text{Sin}[\omega*i*\Delta t + \theta] - \in_i)*\text{Sin}[\omega*i*\Delta t + \theta] = 0.$$

It is also assumed that noise is not correlated with the signal and so the terms with $\in_i$ will be dropped from the sums. This approximation improves as the number of terms increases.

Further, assume that $\omega=\omega_2+\delta\omega$ and Abs[$\delta\omega$]<<$\omega$. Using algebraic manipulation, it is possible to write $J=\Sigma_{i=1}^{Q_j}(P_i-A*X_i-\beta*Y_i-C*Z_i-D*U_i-E*V_i-F*W_i)^2$ where $A \equiv \delta\omega*\text{Cos}[\theta]*B$, $\beta \equiv \text{Sin}[\theta]*B$, $C \equiv \text{Cos}[\theta]*B$, $D \equiv -\delta\omega^2*\text{Cos}[\theta]*B$, $E \equiv -\delta\omega^2*\text{Sin}[\theta]*B$, $F \equiv -\delta\omega*\text{Sin}[\theta]*B$, and $U_i \equiv \frac{1}{2}*i^2*\Delta t^2*\text{Sin}[i*\Delta t*\omega_2]$, $V_i \equiv \frac{1}{2}*i^2*\Delta t^2*\text{Cos}[i*\Delta t*\omega_2]$, $W_i = i*\Delta t*\text{Sin}\ [i*\Delta t*\Delta t_2]$, $X_i = i*\Delta t*\text{Cos}\ [i*\Delta t*\omega_2]$, $Y_i = \text{Cos}\ [i*\Delta t*\omega_2]$, and $Z_i = \text{Sin}\ [i*\Delta t*\Delta t_2]$.

The quadratic terms in $\delta\omega$ that have been retained in D and E can be dropped if desired, but they do serve as an additional measure of the frequency change.

B is positive by definition and can be determined from $B^2 = A^2 + \beta^2$. The algebraic sign of B can be arbitrarily assigned since it can be taken up in the term $\theta$, which can be determined from the four quadrant arctangent function using B and C. Care must be taken, since different mathematical processing packages may define this function differently.

There are several ways of determining the value of $\delta\omega$, including the following:

$\delta\omega^2 = (A^2 + F^2)/B^2$, $\delta\omega^4 = (D^2 + E^2)/B^2$, or $\delta\omega^4 = (D^2 + E^2)/(A^2 + F^2)$.

Since $\theta$ can be determined before $\delta\omega$ is determined, the algebraic sign of $\delta\omega$ can be determined using A and F. For a valid solution, the signs obtained using A and F should be consistent with each other.

Note that the data can be examined as it is digitized and noisy points can be eliminated. Thus, not every sample needs to be used in the fit. A specialized Fourier series could also be used with a limited number of frequency terms included—perhaps only those that are within a selected distance of the surface clock frequency. This action may involve the regular spacing of samples and selecting the sampling frequency from a discrete set.

Implications of the Assumption that $\phi$ is Constant

As will be discussed later, a number of potential noise sources may enter into the analysis. It was assumed earlier that $\phi$ is constant over the time interval during which the frequency is measured. However, if drilling operations are advancing, this may not be the case, as the following analysis demonstrates. This implies that in some applications, it is useful to hold the drillstring stationary while measurements are made.

The propagation speed of a continuous wave through a conductive medium is different from the propagation of an impulse or step-function discontinuity in the field. In a substantially uniform medium, the latter propagation speed has been shown to be given by the celerity in that medium, or $1/\sqrt{\in * \mu}$, where $\in$ is the dielectric constant of the medium and $\mu$ is the permeability. Celerity is thus independent of medium conductivity.

For a continuous wave, and at low frequencies (e.g., frequencies at which the dielectric loss is small compared to the conductive loss), the propagation speed in a conductive medium is given by $$v = \sqrt{\frac{2*\omega}{\mu*\sigma}}$$

where $\omega$ is the angular frequency and $\sigma$ is the conductivity of the medium. Plane wave propagation, which substantially approximates the propagation of an EM telemetry signal (and hence also of the downlinking reference signal) near a drill pipe goes as $e^{-i*(\omega*t - k_r*z) - k_i*z}$, where $k_r$ and $k_i$ are the real and imaginary parts of the wave number. For conductive media at low frequencies, these are equal and are given by the reciprocal of the skin depth:

$$k_r = k_i = \frac{\omega}{v} = \frac{1}{\delta} = \sqrt{\frac{\omega*\mu*\sigma}{2}}.$$

After advancing a distance z, the phase of the wave changes by $k_r*Z$. This makes it possible to calculate the phase shift for the received reference signal, assuming a homogeneous medium as a function of frequency, rate of penetration, and conductivity.

Therefore, let the rate of penetration (ROP) in meters/second be designated by R. Let the acquisition time be designated by T (in earlier nomenclature, $Q*\Delta t = T$). Then the phase shift while acquiring the reference signal is given by $$\Delta\phi = \sqrt{\frac{\omega*\mu*\sigma}{2}} * R * T$$

The frequency error (as a fraction) will be the total elapsed phase of the signal divided by the phase shift, so that the fractional frequency error is given by $$\frac{\sqrt{\frac{\omega*\mu*\sigma}{2}} * R * T}{\omega*T} = R\sqrt{\frac{\mu*\sigma}{2*\omega}},$$

which is independent of T. With a modest ROP of 6 meters/hour, a conductivity of 0.1 mho/meter and a frequency of 1 Hz, the frequency error is $5.27*10^{-7}$, which is two orders of magnitude greater than what is desired.

The conclusion of this analysis is that the clock frequency should not normally be measured while actively drilling when system clock timing stability on the order of $10^{-9}$ is desired. There are two factors that motivate this conclusion:

1. When $\phi$ is a function of time, its effect becomes inseparable from a drift in the frequency.

2. For a linear variation of ROP with time, the relative error is independent of time.

Hence, increasing the acquisition time will not reduce the error that is due to the ROP. If a ROP sensor is incorporated into the down hole tool, the ROP can be included in a correction to the measured frequency as $$\sqrt{\frac{\omega*\mu*\sigma}{2}} * R$$

It should be noted that a positive ROP reduces the apparent frequency of the reference signal.

Thus, in some embodiments, measurement accuracy deteriorates as the ROP increases. However, when certain capability is added to such embodiments, the effect of ROP can be reduced, or eliminated.

For example, consider an embodiment where EM telemetry is used to communicate the reference signal downhole. Continuous measurements of formation resistivity while drilling may be made. Thus, conductivity may be known as a function of clock time. Thin bed effects are negligible at the frequencies suitable for use in such a system, and the rate of change in measured depth can be estimated from the time between drilling breaks (for the addition of drill pipe) and the length of pipe added at each drilling break. This length of time is approximately constant and can be entered into the downhole system prior to well entry, or can be communicated to the downhole system via the use of a telemetry downlink. Alternatively, if two shallow-reading sensors having similar or identical responses are located in the BHA, the ROP can be determined very quickly by correlating the outputs of these two sensors, as is well known to those of ordinary skill in the art.

Using the peak in the correlation of the two sensor outputs as a function of time, it is possible to determine how long it took for the drillstring to advance from a location where (for example) a bed boundary was visible in the lower sensor in the drill string, to the location where it became visible in the upper sensor in the drillstring. Since the separation between the two sensors is known, the rate of penetration can be calculated. Once this is known, the error in the measured frequency of the reference signal relative to the frequency at its point of generation can be calculated and applied as a correction.

Interpolating Between Measurements

In those cases where the frequency of the reference signal cannot be measured continuously, it may still be useful to provide a continuous correction to the time of the downhole clock. In this case, the correction is only known at a discrete number of instants of time (more precisely, it is only known over the discrete number of time intervals during which the frequency of the downhole clock was determined). However, it should be possible to determine the clock frequency every time there is a break in drilling activity, and whenever a SWD measurement is made (since the drill is stationary during such measurements).

The ROP varies widely, but a typical range would be from 20 to 200 feet per hour. With a drilling break occurring every 30 meters in order to add a stand of pipe, this corresponds to a time range from 4.5 hours down to 27 minutes. An unknown number of seismic while drilling measurements will also be made over the maximum mission life of 200 hours. In this case, in addition to measurements taken during seismic while drilling measurements, there will be between 44 and 444 measurements of clock frequency over the mission life. These measurements can be fit to a time series, such as a trigonometric series, or local approximations to frequency drift can be made using polynomials over a sliding time window. In addition, interpolation between measurements can be carried out with such techniques as cubic splines. However, it is often useful to use regression techniques since goodness of fit measures are available for these techniques as well as estimates of the statistical significance of coefficients (which can be used to model the significance of each of the coefficients used in a regression, and hence to optimize the final model selected for the regression), and estimates of the error in the model itself (which can be used to provide some of the information that is otherwise available via Allan Variance analyses).

Accounting for Drift in the Frequency of the Surface Master Oscillator

In the prior analysis, it was assumed that the frequency drift of the surface master oscillator small enough to be neglected over the mission lifetime. This assumption is not essential, although increased utility is obtained when the surface oscillator is not allowed to drift at a rate that is comparable to that of the downhole oscillator.

The time correction methods described herein assume that the frequency of the surface oscillator is known. If the frequency of the surface master oscillator does drift, but is measured with another device, then these times can be corrected using a log of the actual frequency of the surface master oscillator as a function of time (since the downhole time measurements were correcting assuming a fixed frequency for the surface master oscillator).

Alternatively, if it should become useful to provide this correction in real time downhole, the frequency of the surface oscillator can be transmitted to the downhole system via telemetry downlink (e.g., EM or mud pulse telemetry). Although data rates are relatively slow, this method should suffice for any usable drift rate associated with the surface clock.

Noise Sources

The downhole measurement of the reference signal may be corrupted by noise. The most prominent source may depend on whether measurements are made while drilling, or while stationary.

Whether stationary or drilling, electronic noise and magnetotelluric noise may be present at amplitudes that corrupt the measured reference signal. Electronic noise should be controllable by design.

Figure 3:
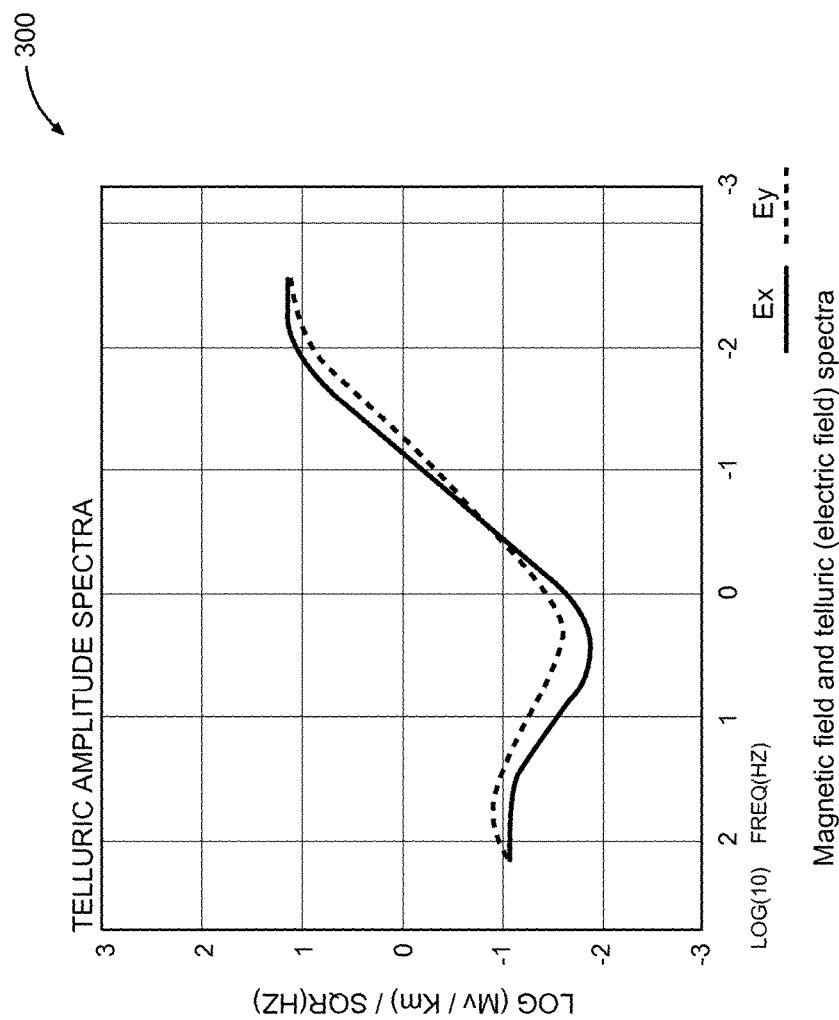
FIG. 3 is a graph of telluric amplitude spectra according to various embodiments of the invention.

Magnetotelluric noise varies with latitude, to a certain extent with longitude, and with the local conductivity of the Earth. A graph 300 of magnetotelluric electric field noise vs. frequency is shown in FIG. 3, as taken from "Magnetotelluric Exploration for Hydrocarbons," Arnold S. Orange, Proceedings of the IEEE, Vol. 77, No. 2, February 1989, P. 287., et. seq. In some embodiments, an antenna gap used in communicating between the earth's surface and a downhole device via a low frequency electromagnetic link is no more than 2 inches in length. Thus, even making measurements in a bandwidth as wide as 1 Hz, the expected noise when observing a 1 Hz reference signal is on the order of 1.6 nanovolts. Furthermore, as an electromagnetic signal, this should experience the same attenuation rule as the downlink signal. For example, when the downlink signal has been attenuated by 60 dB, the magnetotelluric noise will also have been attenuated by 60 dB, which is on the order of picovolts. Thus, magnetotelluric noise does not appear to be significant when making measurements with an insulating gap as a downhole antenna.

Figure 4:
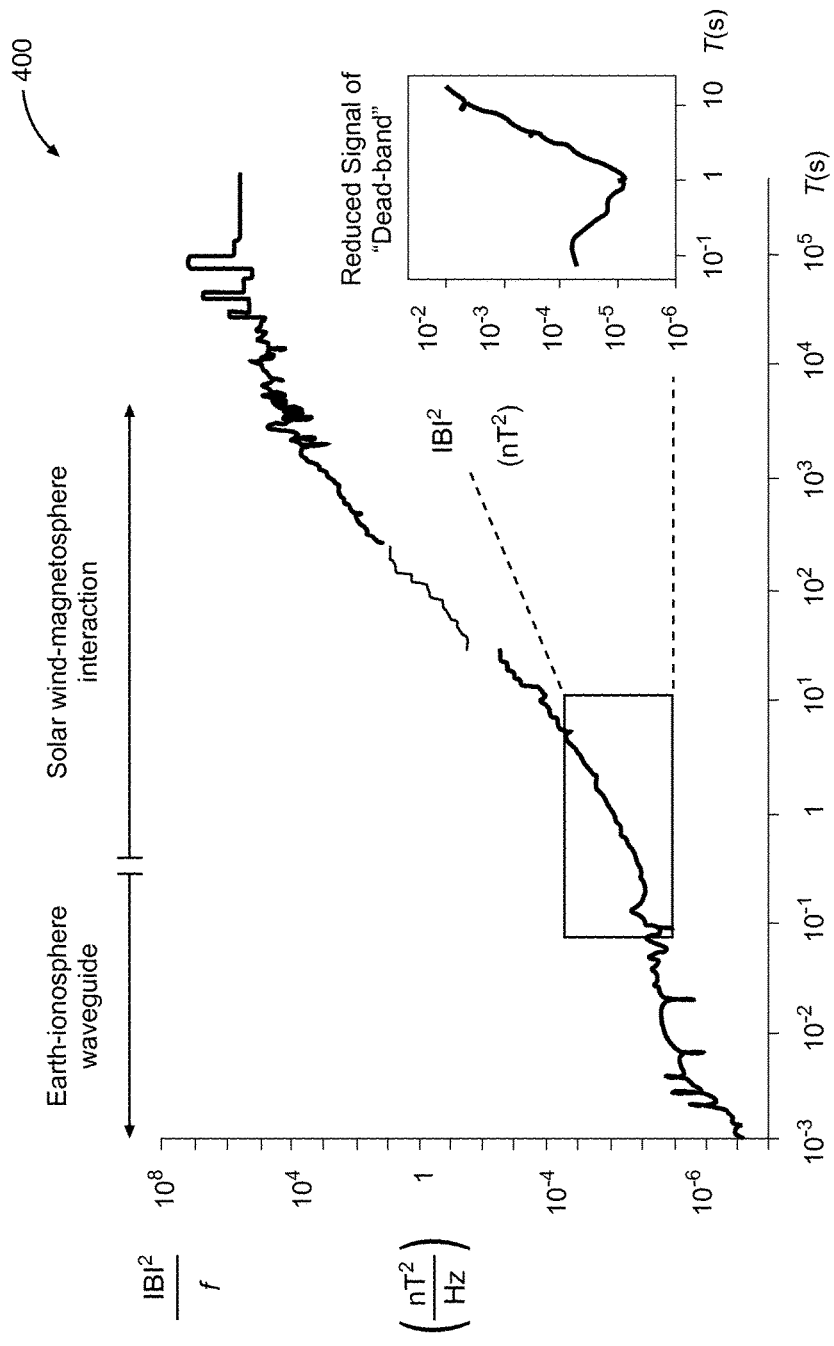
FIG. 4 is a graph of magnetic field interaction with the Earth according to various embodiments of the invention.

If the measurement is made with a toroid, then in addition to magnetotelluric noise induced along the drillstring via its electric field, there will also be a component induced directly in the toroid via magnetic induction. As an example, FIG. 4 shows a graph 400 of magnetotelluric magnetic field noise. This figure is taken from the book "Practical Magnetotellurics," Fiona Simpson and Karsten Bahr, The University Press, Cambridge, 2005. Here it can be seen that when observing a 1 Hz reference, the expected noise level is on the order of $10^{-6}$ nT$^2$/Hz. Even with a 1 Hz bandwidth, this is on the order of 1 pT, which is not observable with most present downhole instrumentation. Again, it would seem that this source of noise can be ignored.

There are many more noise sources that come into prominence when the methods of various embodiments are implemented while drilling. For example, there is the ROP contribution mentioned earlier. In addition, drillstring rotation, variation of rotational speed, lateral tool motion, and bit bounce can induce currents in the drillstring. In the absence of an insulating gap, experimentation has shown that noise from these sources may be as high as 120 nT in a 1 Hz bandwidth around 1 Hz. Unlike the magnetelluric noise levels, these sources may be non-negligible, depending on whether an insulating gap or a toroid is used with an antenna.

To this point, several mechanisms have been discussed to measure the frequency of the propagated timing signal using the downhole master oscillator. One of these includes using a Schmidt trigger (or similar circuit) to record the number of clock cycles between zero crossings of the received signal. This count is used to estimate the period, and hence the frequency of the received signal in downhole time units. Mechanisms for improving the estimated times and for dealing with their statistics are also taught.

Another approach includes digitizing the received low frequency signal at a sample rate that is determined using the downhole master oscillator. Regressions to a sinusoidal signal with an amplitude and phase are made over selected time windows of the digitized data stream. The frequencies recovered using regression techniques are the frequencies of the observed lower frequency signals in downhole time units.

An Approach that Uses an Imprecise Downhole Clock

Yet another approach exists, and will now be explained. This approach involves generating the downhole clock signal directly from the low frequency reference signal.

The division of the source clock frequency by an integer N and multiplication by an integer M could be simplified to division by an integer N, perhaps limiting the range of frequencies that can be used. In this case, a downhole clock signal can be generated from a precise reference signal using analog electronics. Here, the factor of "M" can be selected so that reception of fundamental frequency harmonics is suppressed. A phase-locked loop (PLL) can be used in a frequency multiplier embodiment to generate a signal that has a frequency of N times the reference frequency. Similarly, a PLL can be used with the new signal to produce another signal that has a frequency of N/M times that of the reference frequency, i.e. the frequency of the oscillator at the Earth's surface. This approach may suffice in some applications, since the signal produced by a PLL that is a multiple of a reference frequency has the same stability as that of the reference signal. With a long-term stable reference, this PLL approach might perform in a useful fashion.

To mitigate short-term losses in reception of the reference signal, and provide better continuity, the voltage on the voltage controlled oscillator can be locked when the reference signal is lost. This will allow the system to continue operations over short intervals. Alternatively, a backup oscillator of known frequency, perhaps measured using the PLL when it is operating, can be used for short duration outages of the PLL.

Offshore Applications

Some embodiments for propagating a signal to the downhole tool use low frequency electromagnetic radiation, such as exists in a commercial EM telemetry system. Due to the high attenuation of electromagnetic signals in sea water, such systems may not be useful in deep offshore water with the transmitter at the surface of the sea, that is, at "sea level". This is because sea water has a conductivity of about 4 mhos/meter, so that a 1 Hz signal in an EM telemetry system will be attenuated by a factor of about 54 dB when traversing 1 Km of sea water. However, some offshore applications operate at a depth on the order of 2 Km.

Figure 5:
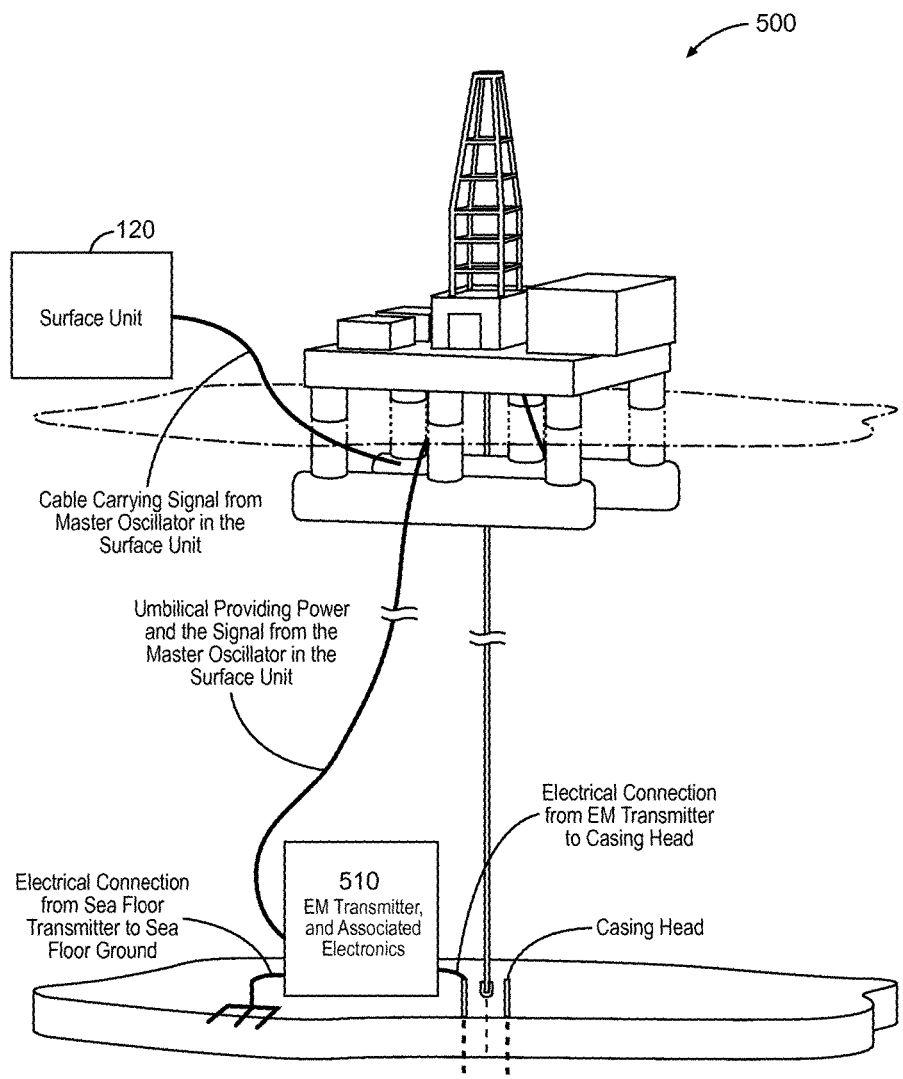
FIG. 5 is a block diagram of apparatus and systems according to various embodiments of the invention.

Thus, in water that is deeper than a few hundred meters, the electromagnetic signal may be launched from the sea floor. When the signal is launched from the sea floor, the loss due to propagation in the sea is irrelevant, and the sea acts as a system ground. One way to launch a signal from the sea floor is to place the EM signal generator in a module or pod that sits on the sea floor and power the system using an umbilical power chord from the earth's surface to the sea floor. Those of ordinary skill in the art are aware of mechanisms that provide power from the Earth's surface to the sea floor. Using similar principles, electrical power can be provided to the downhole power generation unit via an umbilical cord from the drilling platform, as shown in FIG. 5. Other electrical signals can also be communicated via the umbilical.

In a sea floor embodiment, it may be useful to locate the master oscillator on the offshore platform since it can then be used as a reference to the surface electronics. In this case, a signal is propagated from the master oscillator to the transmitting unit on the sea floor via a cable in the umbilical. Alternatively, the master oscillator can be located on the sea floor, and a duplicate master oscillator can be located on the drilling platform. This may be more useful when the master oscillator and its duplicate are designed as stable units (e.g., in some embodiments, having a relative drift rate of less than 1 part in $10^9$ over 200 hours).

In the system 500 shown in FIG. 5, a signal taken from the master oscillator of the surface system 120 is transmitted to the sea floor via the umbilical, which also carries power. The signal can be transmitted on a separate wire, or can be combined with the power using mechanisms well known to those of ordinary skill in the art, such as modulating the power line, and separated from the power downhole. After conditioning, the power and the signal are used with a transmitter 510, such as an EM transmitter, that may form a part of the downhole apparatus 148 (see FIGS. 1 and 2) and that drives a signal between the casing head and a remotely grounded point. The cables used to carry the signal to the casing head and the remote grounding point should have sufficient insulation to prevent electrical contact with the sea water.

Figure 6:
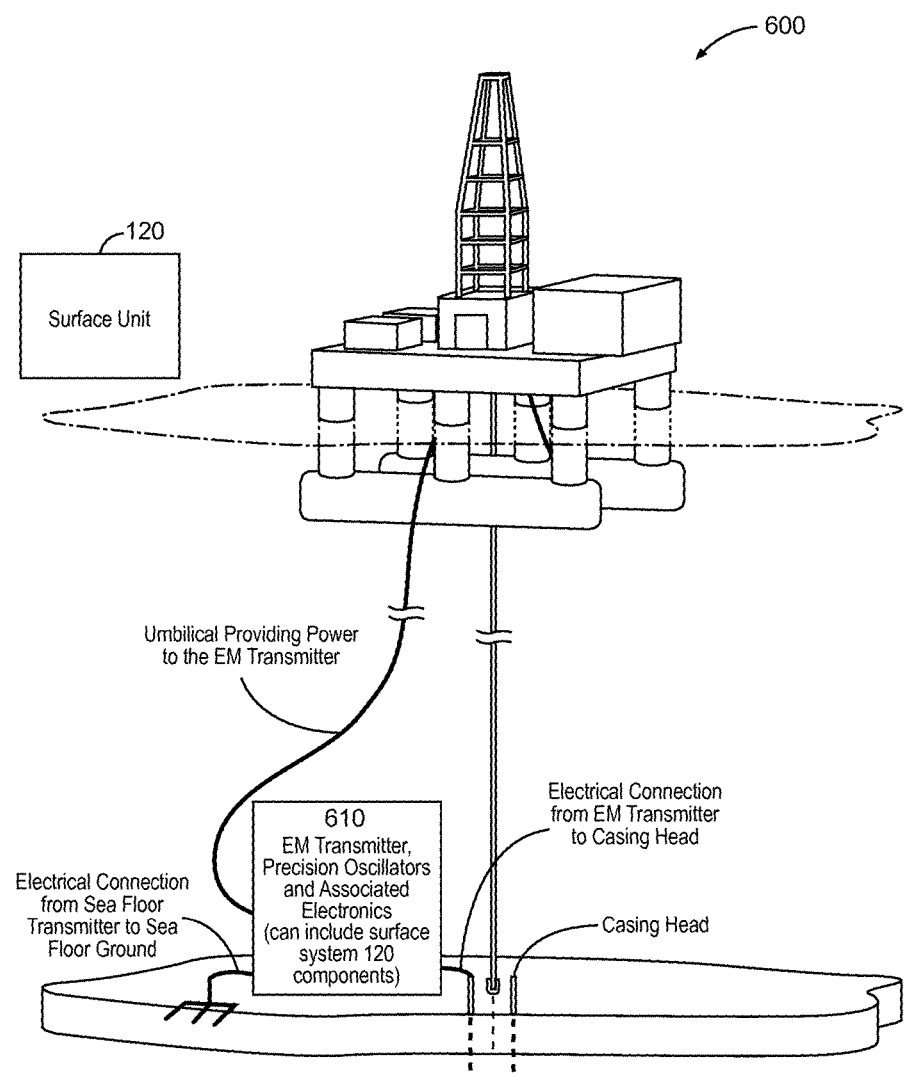
FIG. 6 is a block diagram of apparatus and systems according to various embodiments of the invention.

In the embodiment of FIG. 6, the system 600 includes a master oscillator in the surface system 120 and one in the unit 610 on the sea floor (which may include a transmitter 510, and one or more components of the downhole apparatus 148, shown in FIGS. 1 and 2). For many applications, the two units should have a relative drift with respect to each other of less than 1 part in $10^9$. In deep water, the ambient temperature should be relatively stable, and sea floor oscillator can be stabilized using mechanisms well understood by those of ordinary skill in the art.

Alternative Signal Sources

In some embodiments, the signal source is communicated via acoustic telemetry. Thus, the acoustic carrier wave of such a system could be used directly to communicate a reference signal. In a vertical well that is greater than 1,000 meters deep, or a horizontal well more than 1,000 meters long, the carrier wave may be repeated. Hence, in some embodiments, a repeater with a stable latency can be added. This can be achieved using one or more PLLs, but achieving the desired stability may be difficult.

Another approach is to repeat the signal after receiving it within a narrow bandpass. This is possible because the frequency of the signal is accurately known. Such repeaters may be spaced more closely together (e.g., well within the detection limit) to more faithfully replicate the signal without introducing noise. As drill pipe is added to the system, the locations of the telemetry passbands may change. Thus, in some embodiments, the frequency of the reference signal may change in response to information that is communicated to the downhole system.

Another approach is to modulate the acoustic telemetry carrier with a low frequency reference signal (The term "reference signal" is here used to refer to a signal at the precise frequency generated by the surface unit). In this case, the variability of the carrier frequency poses less of a problem.

Figure 7:
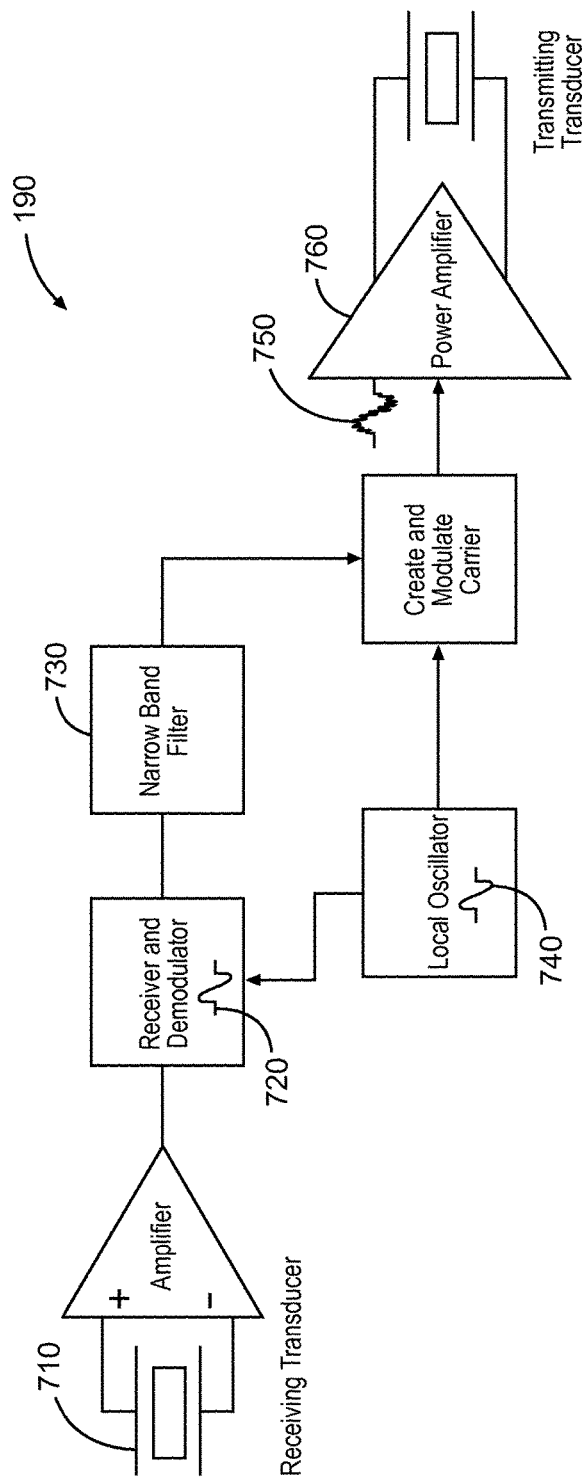
FIG. 7 is a block diagram of a repeater apparatus according to various embodiments of the invention.

FIG. 7 illustrates an embodiment of a repeater 190. The reference signal can be regenerated in the presence of a carrier using this type of apparatus. First, a transducer 710 is used to receive the acoustic signal. The signal is demodulated using known techniques to produce a copy of the reference signal 720. Noise is removed from the reference signal via a narrow band filter 730. A separate carrier signal 740 is generated at a frequency that the acoustic telemetry system can pass, but out of the band of the frequency being received. This carrier 740 is modulated with the regenerated reference signal and used to drive an acoustic signal 750 into the drillstring via a power amplifier 760.

In some embodiments, the signal source is communicated via seismic signaling. In this case, an air gun may be useful, especially for use as offshore seismic sources. They produce bursts of acoustic radiation with a characteristic signal that arises from natural oscillations of the bubbles generated by these sources. Such guns can be fired at very precise times and hence at precise time intervals. However, for the purposes disclosed herein, this type of gun should be fired at a constant rate over long time intervals. Plasma discharge seismic sources might be used in a similar fashion.

Continuous wave seismic sources can be generated using seismic vibrators, to propagate energy signals into the environment over an extended period of time as opposed to the near instantaneous energy provided by impulsive sources. The source signal using this method might be generated by a servo-controlled hydraulic vibrator or shaker unit mounted on a mobile base; electro-mechanical versions have also been developed. Such a source could function in land-based applications as well. For offshore applications, it should be possible to operate this type of unit on the sea floor via the umbilical shown in FIG. 5. Because these devices are electromechanical, precise timing is possible, so they can be driven as high energy seismic sources with relatively high frequency stability.

Seismic vibrator clock synchronization is similar to clock synchronization with an EM signal. Instead of using a downhole EM antenna, a geophone or hydrophone or accelerometer are used. Note that seismic wave speeds are comparable to the speeds of EM waves in moderately conductive media. Hence, the prior analysis indicates it may be more useful to make timing measurements with any type of seismic system while drilling activity is paused.

Another mechanism that can be used to communicate the reference signal to the downhole system involves mud pulse telemetry. Thus, some embodiments may include a surface transmitter for generating pressure pulses, a control system, and a downhole receiver for receiving and decoding pulses. The operation of this system can be precisely controlled. The downlink operates by opening and closing a choke under computer control. Instead of using such a system as a telemetry downlink, it can be cycled at a constant frequency and thus used to transmit a signal at the frequency of the reference signal downhole—via pressure modulations in the mud stream.

In a mud pulse telemetry system, the downhole EM receiver could be replaced by a pressure transducer in the bore of the downhole system. The signal frequency should be chosen so that it is out of the telemetry downlink and uplink bandpass frequencies, as well as the range of frequencies normally generated by the pumps used to circulate the drilling fluid. Hence, a reference frequency that is considerably below 1 Hz might be selected. As is the case with seismic sources, timing measurements using mud pulse telemetry may be more effective when drilling activity has ceased.

Thus, referring now to FIGS. 1-7, it can be seen that many embodiments may be realized, including an apparatus 148 that comprises a downhole clock 124, a reception circuit (perhaps a combination of the receiver 144 and the reception element 136), a measurement circuit 180, 280 and a processor 128, 228.

For example, in some embodiments, an apparatus 148 may comprise a downhole clock 124 and a reception element 136 to receive a derived clock signal when the downhole clock 124 is located downhole, the derived clock signal derived from a surface clock signal associated with a surface clock 121, wherein a frequency of the derived clock signal is less than one-fifth of a frequency of the surface clock signal. The apparatus 148 may further include a measurement circuit 180 to measure the frequency of the derived clock signal in terms of an uncorrected downhole clock frequency associated with the downhole clock 121 to provide a measured frequency, as well as a processor 128, 228 to determine the actual frequency of the downhole clock 124 based on the measured frequency.

A housing may be used to enclose and protect the downhole clock 124 and the processor 128, 228. Thus, in some embodiments, the apparatus 148 may comprise a housing (e.g., some portion of a SWD tool 156) to contain the downhole clock 124 and the processor 128, 228. As will be discussed more fully below, the housing may comprise any number of enclosures, including a drill string sub or a wireline sonde (see e.g., element 970 in FIG. 9, and element 1024 in FIG. 10).

The reception element 136 may be constructed from an insulating gap, a coil (e.g., a toroidal inductor), or other components. Thus, in some embodiments, the reception element 136 comprises one or more insulating gaps 132 and/or one or more coils 140.

The apparatus may also include a transmission mechanism, to transmit the derived clock signal downhole. Thus, in some embodiments, the apparatus 148 comprise a transmitter (e.g., power amplifier 164 and/or a repeater 190) to transmit the derived clock signal to the reception element 136.

Various mechanisms can be used to transmit the derived clock signal downhole. Thus, in some embodiments, the transmitter 510 comprises one or more telemetry sources, one or more seismic signal sources, and/or one or more pressure wave sources. In some embodiments, a telemetry source comprises an acoustic telemetry source. In some embodiments, a telemetry source comprise an electromagnetic telemetry source.

The transmitter 510 can be placed on the Earth's surface, above or below the waterline, among other locations. Thus, in some embodiments, the transmitter is located on a sea floor, as shown in FIGS. 5 and 6.

The surface clock 121 can be located on the surface of the Earth (above or below the waterline), or on a drilling rig, among other locations. Thus, in some embodiments, the surface clock 121 is located on the sea floor, on a drilling rig, or on land above a waterline, again, as shown in FIGS. 5 and 6.

A carrier-revision repeater can be used to propagate the derived clock signal, to improve transmission signal quality by moving the carrier frequency outside the expected range of interfering noise. Thus, in some embodiments, an apparatus 148 may comprise one or more repeaters 190 to receive the derived clock signal combined with a first carrier frequency, and to retransmit the derived clock signal combined with a second carrier frequency that is different from the first carrier frequency. Some embodiments include a number of methods.

Figure 8:
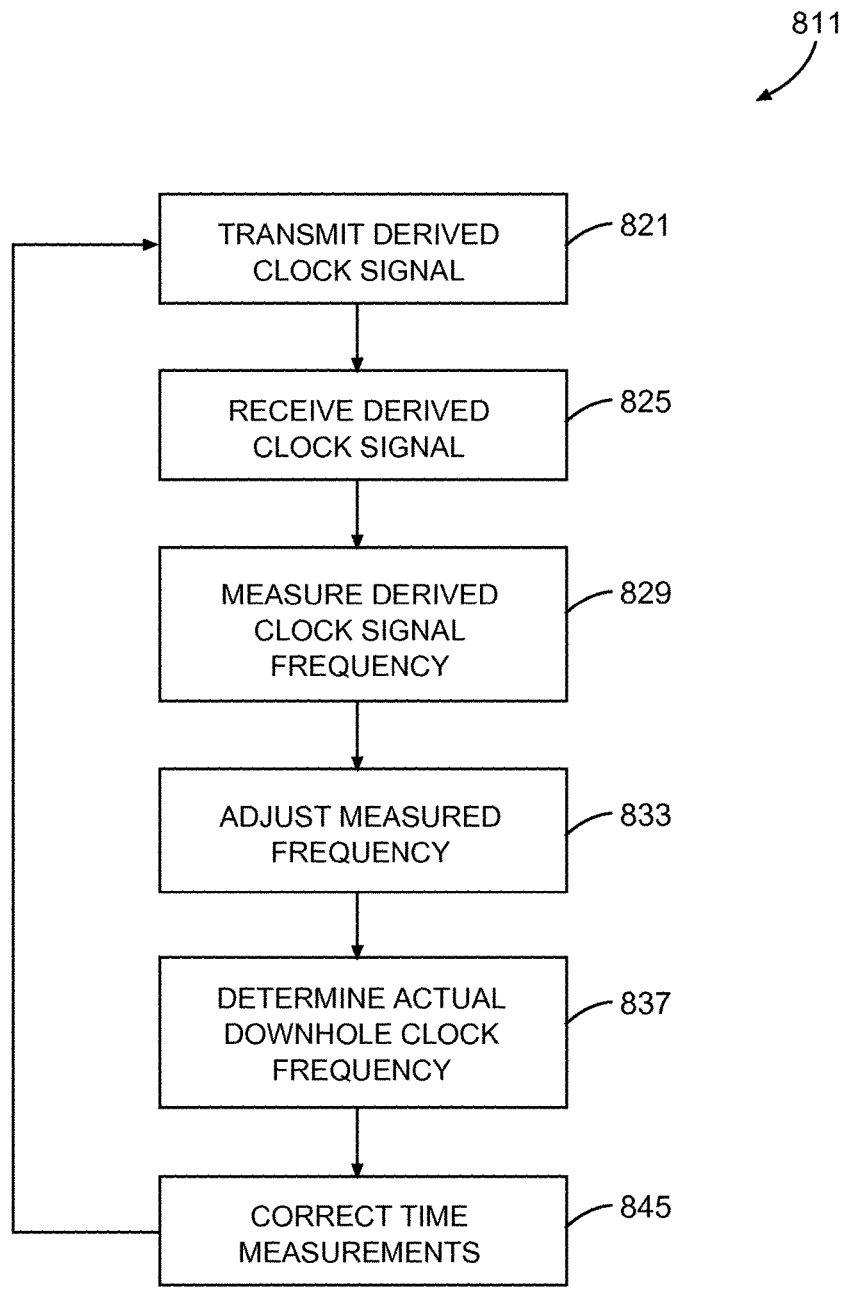
FIG. 8 is a flow chart illustrating several methods according to various embodiments of the invention.

For example, FIG. 8 is a flow chart illustrating several methods 811 according to various embodiments of the invention. One method 811 may comprise receiving a signal derived from a surface clock downhole at block 825, measuring the frequency of the derived clock using the downhole clock at block 829, and determining the actual downhole clock frequency based on the measurement at block 837. Many additional embodiments are possible.

For example, the derived clock signal can be received by a number of elements, including an insulated gap or a coil. Thus, in some embodiments, a method 811 comprises transmitting the derived clock signal downhole at block 821, perhaps to an insulated gap or coil.

The derived clock signal can be transmitted into a well casing, to propagate the transmitted signal from the surface to the downhole clock location. Thus, the activity at block 821 may comprise transmitting the derived clock signal into a well casing.

The derived clock signal may originate at the surface of the Earth, or a drilling platform. The surface of the Earth may comprise dry land, or an underwater surface of the Earth, such as a ledge or a floor of the ocean. Thus, the activity at block 821 may comprise transmitting the derived clock signal from a surface of the Earth or a drilling platform.

In some embodiments, the method 811 comprises receiving a derived clock signal downhole at block 825, where the derived clock signal derived from a surface clock signal associated with a surface clock. In some embodiments, the frequency of the derived clock signal is less than one-fifth of a frequency of the surface clock signal.

If no compensation is made for the rate of penetration, or if drilling conditions are very noisy, it may be useful to pause drilling operations while downhole clock calibration measurements are made. Thus, in some embodiments, the activity at block 825 may include receiving the derived clock signal at an insulated gap of a drill string during a pause in a drilling operation, when a drill bit coupled to the drill string is at rest.

In some embodiments, the method 811 comprises, at block 829, measuring the frequency of the derived clock signal in terms of an uncorrected downhole clock frequency associated with a downhole clock to provide a measured frequency equivalent. For example, the measured frequency equivalent of the derived clock signal may be its actual frequency, or an equivalent of the actual frequency, such as its period.

Therefore, in some embodiments, the frequency of the derived clock signal can be determined by using the downhole clock to measure the length of individual derived clock cycles. Thus, the activity at block 829 may comprise counting a number of downhole clock ticks defined by a preselected number of cycles associated with the derived clock signal, the period of each of the downhole clock ticks being defined by the uncorrected downhole clock frequency.

In some embodiments, the detection of zero-crossing events associated with the derived clock signal can be used to determine the frequency of the derived clock signal. Thus, the activity at block 829 may comprise analog waveform sampling of the derived clock signal at intervals defined by the uncorrected downhole clock frequency.

In some embodiments, it may be useful to convert the analog signal into a digital signal, and estimate the frequency of the digital signal. Thus, the activity at block 829 may comprise converting an analog waveform into a digital signal, and estimating the frequency of the digital signal according to intervals defined by the uncorrected downhole clock frequency.

The rate of penetration that occurs during drilling operations can affect the phase of the derived clock signal. Some embodiments operate to estimate or measure the rate of penetration in real time, so that appropriate adjustments can be made to the derived clock signal measurements. Thus, the method 811 may continue on to block 833 to include adjusting the measured frequency equivalent according to a measured or inferred rate of penetration associated with a downhole drilling operation.

The method 811 may continue on to block 837 to comprise determining the actual frequency of the downhole clock based on the measured frequency equivalent. To determine the actual downhole clock frequency, a mapping between ticks of the surface clock and ticks of the downhole clock can be developed. Thus, the activity at block 837 may comprise determining a mapping between ticks of the surface clock and ticks of the downhole clock.

In some embodiments, once the actual downhole clock frequency is determined, a correction can be applied to measurements made by the downhole clock. Thus, the method 811 may go on to block 845 to include correcting time measurements made using the downhole clock, based on the actual frequency of the downhole clock. In some embodiments, the method 811 includes repeating one or more of the actions at blocks 821, 825, 829, 833, 837, and 845.

Thus, in some embodiments, the frequency of the received reference signal is not measured per se, but instead, the sampled time intervals are adjusted by multiplying them by a ratio of the expected number of samples per cycle to the received number of samples per cycle. This would indicate, for example, that if there are too many samples, the time intervals downhole are shorter than those at the surface, and vice-versa. In this time-based method, the actual measurement times may then be adjusted in the same way as with the frequency-derived method, discussed previously.

The same reception apparatus can be used to mark the beginning of a cycle for the reference waveform, or to digitize the reference waveform. The same kind of regressions would also be useful. Thus, in some embodiments, the activity at block 845 may comprise correcting time measurements made using the downhole clock, based on the measured frequency equivalent of the derived clock (e.g., the actual frequency of the derived clock, or an equivalent, such as the period of the derived clock), or on the actual frequency of the downhole clock.

The stability of the surface clock should be greater than the stability of the downhole clock. Thus, in some embodiments, the stability of the frequency of the surface clock signal may be at least ten times greater than a stability of the uncorrected downhole clock frequency.

The frequency of the derived clock in most embodiments will be relatively low, when compared to the surface or downhole clock frequencies. Thus, in some embodiments, the frequency of the derived clock signal is about 0.1 cycles per second to about 100 cycles per second. In some embodiments, the frequency of the surface clock signal is approximately the same as the uncorrected downhole clock frequency.

The frequency of the derived clock signal can be determined by multiplying and dividing, or dividing and multiplying, perhaps by integral amounts, the frequency of the surface clock signal. Thus, in some embodiments, the frequency of the derived clock signal is related to the frequency of the surface clock signal by a factor of M/N, where M and N are integers.

It should be noted that the methods described herein do not have to be executed in the order described, or in any particular order. Moreover, various activities described with respect to the methods identified herein can be executed in iterative, serial, or parallel fashion. The various elements of each method (e.g., the activities and methods shown in FIG. 8) can be substituted, one for another, within and between various parts of the activities and methods. Information, including parameters, commands, operands, and other data, can be sent and received in the form of one or more carrier waves.

Figure 9:
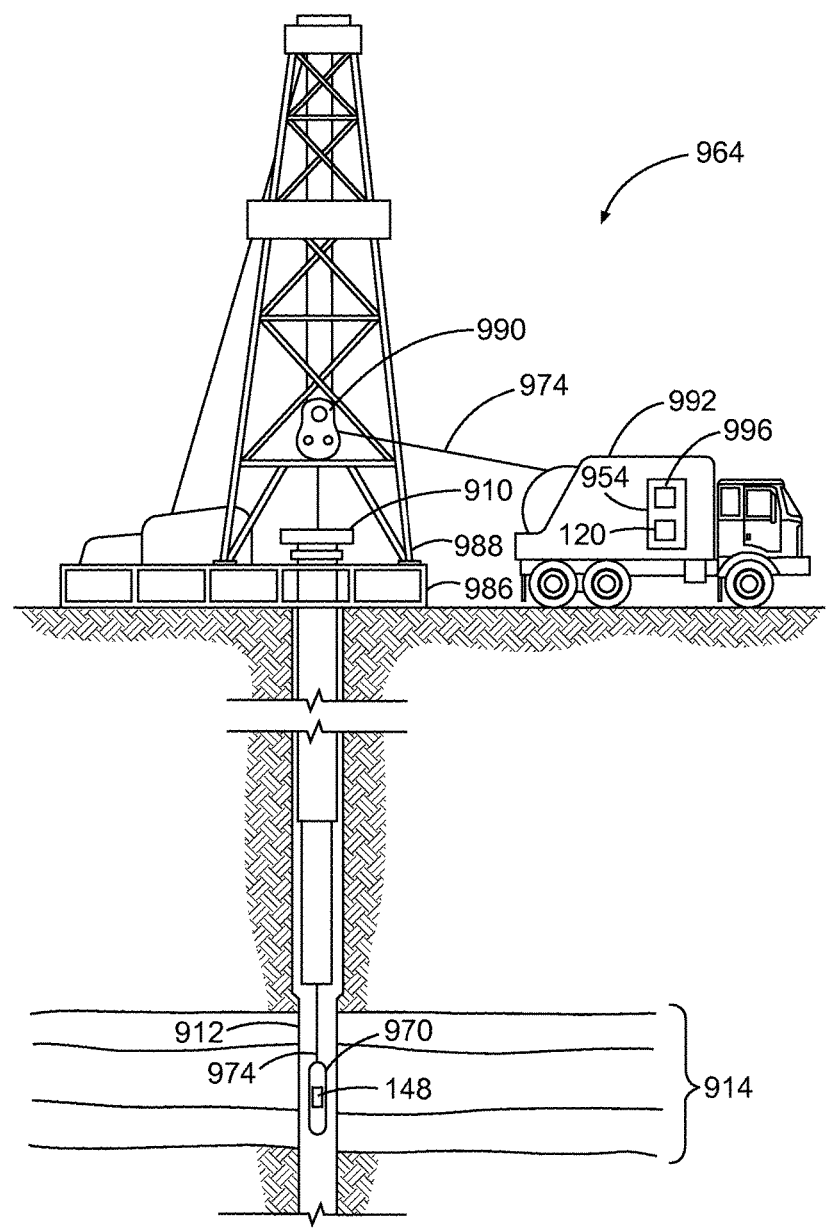
FIG. 9 illustrates a wireline system embodiment of the invention.
Figure 10:
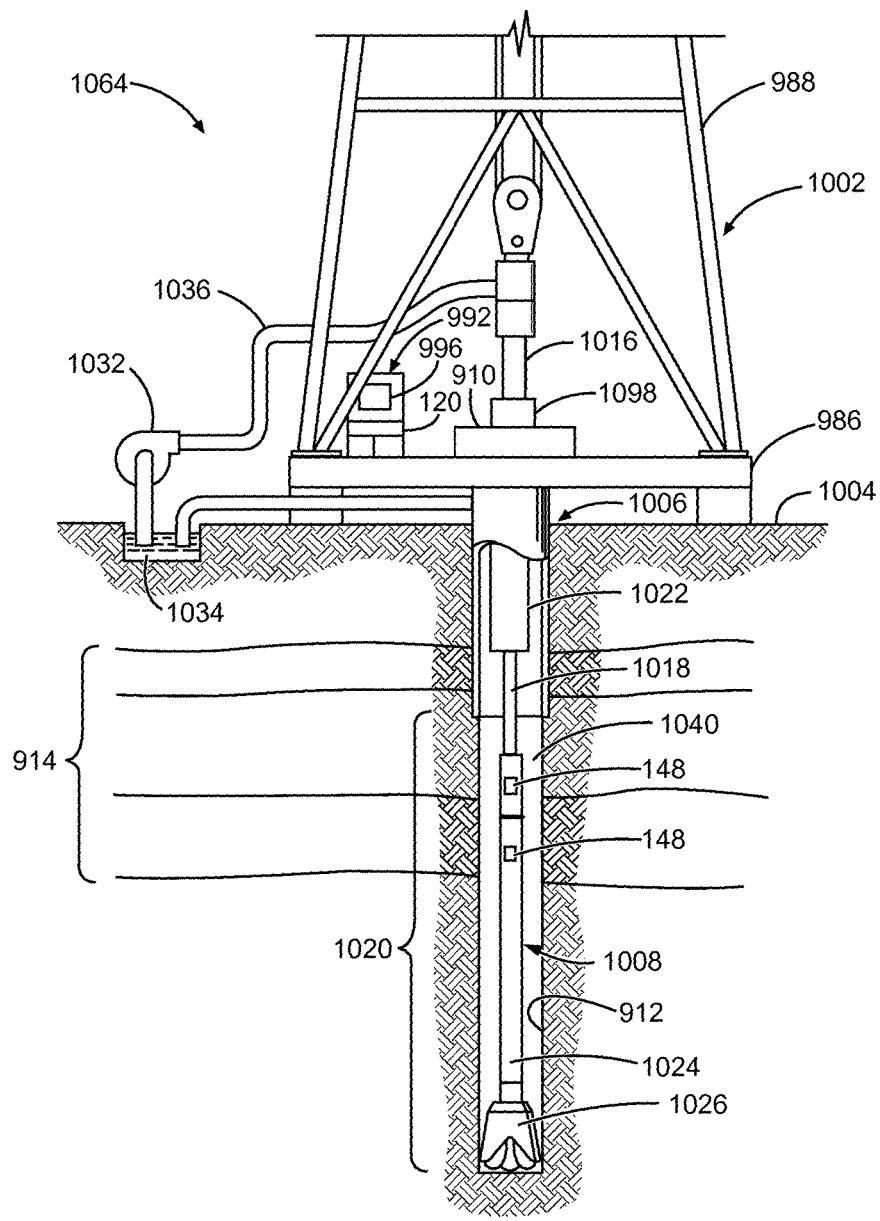
FIG. 10 illustrates a drilling rig system embodiment of the invention.

FIG. 9 illustrates a wireline system 964 embodiment of the invention, and FIG. 10 illustrates a drilling rig system 1064 embodiment of the invention. The systems 964, 1064 may thus comprise portions of a wireline logging tool body 970 as part of a wireline logging operation, or of a down hole tool 1024 as part of a down hole drilling operation.

Referring now to FIG. 9, a well during wireline logging operations can be seen. In this case, a drilling platform 986 is equipped with a derrick 988 that supports a hoist 990.

Drilling oil and gas wells is commonly carried out using a string of drill pipes connected together so as to form a drilling string that is lowered through a rotary table 910 into a wellbore or borehole 912. Here it is assumed that the drilling string has been temporarily removed from the borehole 912 to allow a wireline logging tool body 970, such as a probe or sonde, to be lowered by wireline or logging cable 974 into the borehole 912. Typically, the wireline logging tool body 970 is lowered to the bottom of the region of interest and subsequently pulled upward at a substantially constant speed.

During the upward trip, at a series of depths various instruments (e.g., portions of the apparatus 148, and/or system 120 shown in FIGS. 1 and 2) included in the tool body 970 may be used to perform measurements on the subsurface geological formations 914 adjacent the borehole 912 (and the tool body 970). The measurement data can be communicated to a surface logging facility 992 for processing, analysis, and/or storage. The logging facility 992 may be provided with electronic equipment for various types of signal processing, which may be implemented by any one or more of the components of the system 120 in FIGS. 1 and 2. Similar formation evaluation data may be gathered and analyzed during drilling operations (e.g., during LWD/MWD operations, and by extension, sampling while drilling).

In some embodiments, the tool body 970 is suspended in the wellbore by a wireline cable 974 that connects the tool to a surface control unit (e.g., comprising a workstation 954). The tool may be deployed in the borehole 912 on coiled tubing, jointed drill pipe, hard wired drill pipe, or any other suitable deployment technique.

Turning now to FIG. 10, it can be seen how a system 1064 may also form a portion of a drilling rig 1002 located at the surface 1004 of a well 1006. The drilling rig 1002 may provide support for a drill string 1008. The drill string 1008 may operate to penetrate the rotary table 910 for drilling the borehole 912 through the subsurface formations 914. The drill string 1008 may include a Kelly 1016, drill pipe 1018, and a bottom hole assembly 1020, perhaps located at the lower portion of the drill pipe 1018. As can be seen in the figure, the system 1064 may comprise one or more of the apparatus 148 and/or system 120 shown in FIGS. 1 and 2, including component portions thereof (e.g., repeater(s) 190).

The bottom hole assembly 1020 may include drill collars 1022, a down hole tool 1024, and a drill bit 1026. The drill bit 1026 may operate to create the borehole 912 by penetrating the surface 1004 and the subsurface formations 914. The down hole tool 1024 may comprise any of a number of different types of tools including MWD tools, LWD tools, and others.

During drilling operations, the drill string 1008 (perhaps including the Kelly 1016, the drill pipe 1018, and the bottom hole assembly 1020) may be rotated by the rotary table 410. Although not shown, in addition to, or alternatively, the bottom hole assembly 1020 may also be rotated by a motor (e.g., a mud motor) that is located down hole. The drill collars 1022 may be used to add weight to the drill bit 1026. The drill collars 1022 may also operate to stiffen the bottom hole assembly 1020, allowing the bottom hole assembly 1020 to transfer the added weight to the drill bit 1026, and in turn, to assist the drill bit 1026 in penetrating the surface 1004 and subsurface formations 414.

During drilling operations, a mud pump 1032 may pump drilling fluid (sometimes known by those of ordinary skill in the art as "drilling mud") from a mud pit 1034 through a hose 1036 into the drill pipe 1018 and down to the drill bit 1026. The drilling fluid can flow out from the drill bit 1026 and be returned to the surface 1004 through an annular area 1040 between the drill pipe 1018 and the sides of the borehole 912. The drilling fluid may then be returned to the mud pit 1034, where such fluid is filtered. In some embodiments, the drilling fluid can be used to cool the drill bit 1026, as well as to provide lubrication for the drill bit 1026 during drilling operations. Additionally, the drilling fluid may be used to remove subsurface formation cuttings created by operating the drill bit 1026.

Thus, referring now to FIGS. 1-7 and 9-10, it may be seen that in some embodiments, the systems 964, 1064 may include a drill collar 1022, a down hole tool 1024, and/or a wireline logging tool body 970 to house one or more apparatus 148, similar to or identical to the apparatus 148 described above and illustrated in FIGS. 1 and 2. Components of the system 120 in FIGS. 1 and 2 may also be housed by the tool body 970 or the tool 1024.

Thus, for the purposes of this document, the term "housing" may include any one or more of a drill collar 1022, a down hole tool 1024, or a wireline logging tool body 970 (all having an outer surface, to enclose or attach to magnetometers, acoustic transducers, fluid sampling devices, pressure measurement devices, temperature measurement devices, time measurement devices, transmitters, receivers, repeaters, acquisition and processing logic, and data acquisition systems). The tool 1024 may comprise a down hole tool, such as an LWD tool or MWD tool. The wireline tool body 970 may comprise a wireline logging tool, including a probe or sonde, for example, coupled to a logging cable 974. Many embodiments may thus be realized.

For example, in some embodiments, a system 964, 1064 may include a display 996 to present timing measurement information, both measured and processed/adjusted, as well as database information, perhaps in graphic form. A system 964, 1064 may also include computation logic, perhaps as part of a surface logging facility 992, or a computer workstation 1054, to send signals to transmitters and to receive signals from receivers, and other instrumentation to determine properties of the formation 914 based on the received signals, or calibrated versions thereof.

Thus, a system 964, 1064 may comprise a housing, such as a wireline logging tool body 970 or a down hole tool 1024 (e.g., an LWD or MWD tool body), and portions of one or more apparatus 148 and/or systems 120 attached to the tool body, the apparatus 148 and/or system 120 to be constructed and operated as described previously.

The components of the apparatus 148 and systems 120, 964, 1064 may all be characterized as "modules" herein. Such modules may include hardware circuitry, and/or a processor and/or memory circuits, software program modules and objects, and/or firmware, and combinations thereof, as desired by the architect of the apparatus 148 and systems 120, 964, 1064 and as appropriate for particular implementations of various embodiments. For example, in some embodiments, such modules may be included in an apparatus and/or system operation simulation package, such as a software electrical signal simulation package, a power usage and distribution simulation package, a power/heat dissipation simulation package, and/or a combination of software and hardware used to simulate the operation of various potential embodiments.

It should also be understood that the apparatus and systems of various embodiments can be used in applications other than for drilling operations, and thus, various embodiments are not to be so limited. The illustrations of apparatus 148 and systems 120, 964, 1064 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules. Such apparatus and systems may further be included as sub-components within a variety of electronic systems, such as televisions, cellular telephones, personal computers, workstations, radios, video players, vehicles, signal processing for geothermal tools and smart transducer interface node telemetry systems, among others.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-orientated format using an object-oriented language such as Java or C#. In another example, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 11:
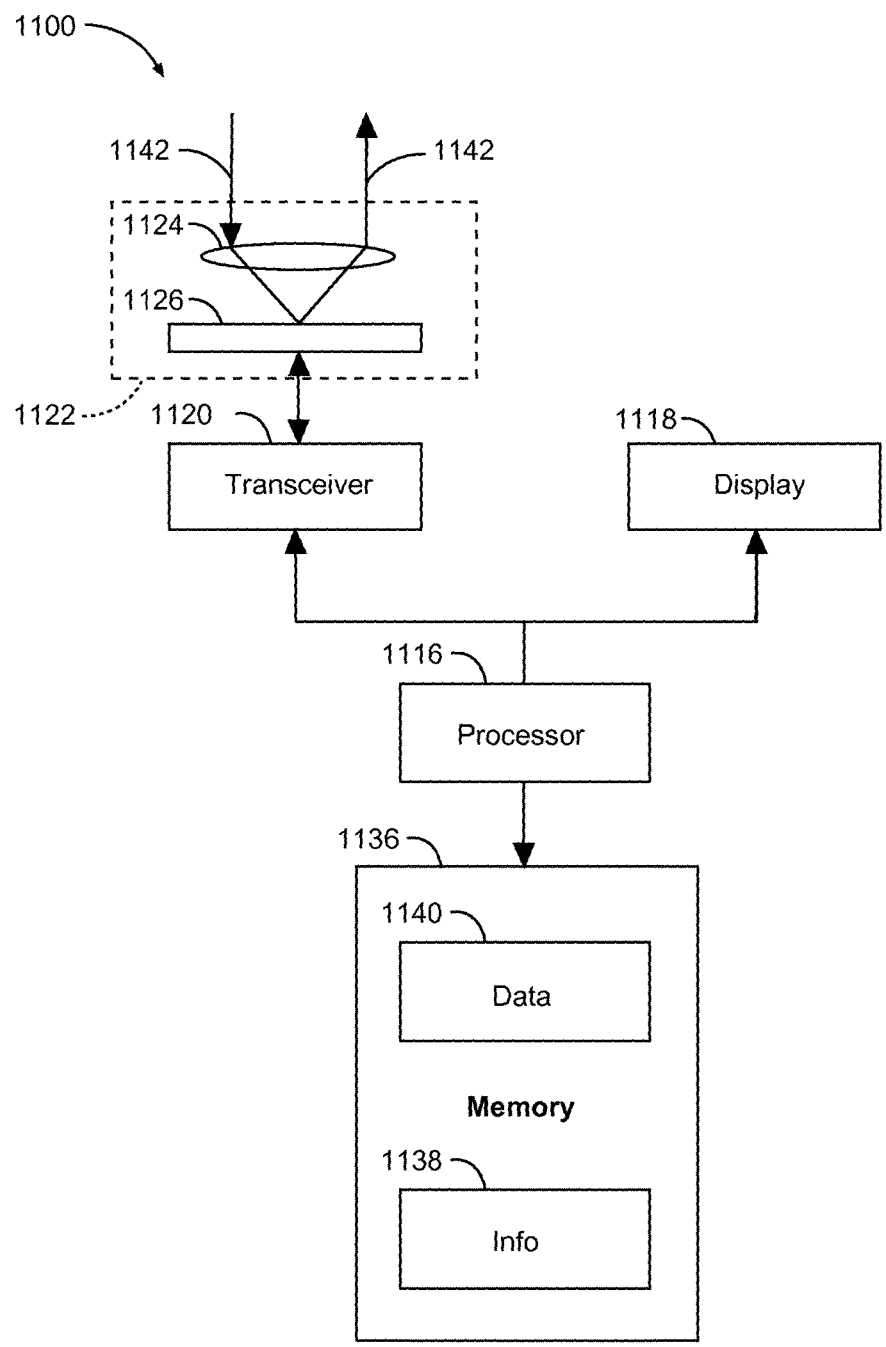
FIG. 11 is a block diagram of an article according to various embodiments of the invention.

For example, FIG. 11 is a block diagram of an article 1100 of manufacture according to various embodiments, such as a computer, a memory system, a magnetic or optical disk, or some other storage device. The article 1100 may include one or more processors 1116 coupled to a machine-accessible medium such as a memory 1136 (e.g., removable storage media, as well as any tangible, non-transitory memory including an electrical, optical, or electromagnetic conductor) having associated information 1138 (e.g., computer program instructions and/or data), which when executed by one or more of the processors 1116, results in the formation of a specific machine (e.g., the article 1100) performing any actions described with respect to the methods of FIG. 8, the apparatus of FIGS. 1 and 2, and the systems of FIGS. 1, 2, 9, and 10. The processors 1116 may comprise one or more processors sold by Intel Corporation (e.g., Intel® Core™ processor family), Advanced Micro Devices (e.g., AMD Athlon™ processors), and other semiconductor manufacturers.

In some embodiments, the article 1100 may comprise one or more processors 1116 coupled to a display 1118 to display data processed by the processor 1116 and/or a wireless transceiver 1120 (e.g., a down hole telemetry transceiver) to receive and transmit data processed by the processor.

The memory system(s) included in the article 1100 may include memory 1136 comprising volatile memory (e.g., dynamic random access memory) and/or non-volatile memory. The memory 1136 may be used to store data 1140 processed by the processor 1116.

In various embodiments, the article 1100 may comprise communication apparatus 1122, which may in turn include amplifiers 1126 (e.g., preamplifiers or power amplifiers) and one or more antenna 1124 (e.g., transmitting antennas and/or receiving antennas). Signals 1142 received or transmitted by the communication apparatus 1122 may be processed according to the methods described herein.

Many variations of the article 1100 are possible. For example, in various embodiments, the article 1100 may comprise a down hole tool, including the apparatus 148 shown in FIGS. 1 and 2. In some embodiments, the article 1100 is similar to or identical to the apparatus 148 or systems 120 shown in FIGS. 1 and 2.

In summary, the apparatus, systems, and methods disclosed herein permit the correction of downhole clock drift, using surface clock timing. This may be accomplished in some embodiments by synchronizing a downhole clock using synchronization of the master oscillator for that clock with a master oscillator on the surface of the Earth. In most embodiments, no specific time values are correlated or updated. Such synchronization may be achieved via wireline and other mechanisms.

Synchronization may be achieved in many embodiments by developing a stable, low frequency signal from a stable, high frequency oscillator at the Earth's surface. This signal can be propagated by various mechanisms (e.g., EM, acoustic, seismic or pressure waves) to downhole sensors that reconvert the signal to an electrical signal. The lower frequency for the derived clock signal is used because propagation losses might otherwise be unacceptable.

Using the apparatus, systems, and methods described herein, the apparent frequency of the received signal in terms of the frequency of the downhole master oscillator can be measured. Since the frequency of the received signal is known precisely, this makes it possible to correct the frequency of the downhole master oscillator. By keeping a time record of the downhole master oscillator's actual frequency (in terms of the units of time as measured from the downhole master oscillator), it is possible to map downhole time units to time units derived from the master oscillator at the Earth's surface.

For these reasons, the accuracy of timekeeping downhole may be increased dramatically. The value of the services provided by an operation/exploration company may thus be significantly enhanced.

The accompanying drawings that form a part hereof, show by way of illustration, and not of limitation, specific embodiments in which the subject matter may be practiced. The embodiments illustrated are described in sufficient detail to enable those of ordinary skill in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
   a downhole clock;
   a reception element to receive a derived clock signal when the downhole clock is located downhole, the derived clock signal derived from a surface clock signal associated with a surface clock, wherein a frequency of the derived clock signal is less than one-fifth of a frequency of the surface clock signal;
   a measurement circuit to measure the frequency of the derived clock signal in terms of an uncorrected downhole clock frequency associated with the downhole clock to provide a measured frequency equivalent; and
   a processor to correct time measurements made using the downhole clock, based on the measured frequency equivalent of the derived clock, or based on an actual frequency of the downhole clock determined according to the measured frequency equivalent.

2. The apparatus of claim 1, further comprising:
   a housing to contain the downhole clock and the measurement circuit, wherein the housing comprises one of a drill string sub or a wireline sonde.

3. The apparatus of claim 1, wherein the reception element comprises at least one of an insulating gap or a coil.

4. The apparatus of claim 1, further comprising:
   a transmitter to transmit the derived clock signal to the reception element.

5. The apparatus of claim 4, wherein the transmitter comprises at least one of a telemetry source, a seismic signal source, or a pressure wave source.

6. The apparatus of claim 4, wherein the transmitter is located on a sea floor.

7. The apparatus of claim 1, wherein the surface clock is located on the sea floor, on a drilling rig, or on land above a waterline.

8. The apparatus of claim 1, further comprising:
   at least one repeater to receive the derived clock signal combined with a first carrier frequency, and to retransmit the derived clock signal combined with a second carrier frequency that is different from the first carrier frequency.

9. A method, comprising:
   receiving a derived clock signal downhole, the derived clock signal derived from a surface clock signal associated with a surface clock, wherein a frequency of the derived clock signal is less than one-fifth of a frequency of the surface clock signal;
   measuring the frequency of the derived clock signal in terms of an uncorrected downhole clock frequency associated with a downhole clock to provide a measured frequency equivalent; and
   determining an actual frequency of the downhole clock based on the measured frequency equivalent, including determining a mapping between ticks of the surface clock and ticks of the downhole clock.

10. The method of claim 9, further comprising:
    correcting time measurements made using the downhole clock, based on the measured frequency equivalent, or an actual frequency of the downhole clock.

11. The method of claim 9, wherein a stability of the frequency of the surface clock signal is at least ten times greater than a stability of the uncorrected downhole clock frequency.

12. The method of claim 9, wherein the frequency of the derived clock signal is about 0.1 cycles per second to about 100 cycles per second.

13. The method of claim 9, wherein the measuring comprises counting a number of downhole clock ticks defined by a preselected number of cycles associated with the derived clock signal, a period of each of the downhole clock ticks being defined by the uncorrected downhole clock frequency.

14. The method of claim 9, wherein the measuring comprises analog waveform sampling of the derived clock signal at intervals defined by the uncorrected downhole clock frequency.

15. The method of claim 9, wherein the measuring further comprises:
    converting an analog waveform into a digital signal; and
    estimating a frequency of the digital signal according to intervals defined by the uncorrected downhole clock frequency.

16. The method of claim 9, wherein the frequency of the surface clock signal is approximately the same as the uncorrected downhole clock frequency.

17. The method of claim 9, wherein the receiving comprises:
 receiving the derived clock signal at an insulated gap of a drill string during a pause in a drilling operation, when a drill bit coupled to the drill string is at rest.

18. The method of claim 9, further comprising:
 transmitting the derived clock signal to an insulated gap or coil downhole.

19. The method of claim 9, further comprising:
 transmitting the derived clock signal from a surface of the Earth or a drilling platform.

20. A non-transitory machine-readable medium having instructions stored therein, wherein the instructions, when executed by a processor, result in a method comprising:
 receiving a derived clock signal downhole, the derived clock signal derived from a surface clock signal associated with a surface clock, wherein a frequency of the derived clock signal is less than one-fifth of a frequency of the surface clock signal;
 measuring the frequency of the derived clock signal in terms of an uncorrected downhole clock frequency associated with a downhole clock to provide a measured frequency equivalent; and
 determining an actual frequency of the downhole clock based on the measured frequency equivalent, including determining a mapping between ticks of the surface clock and ticks of the downhole clock.

21. The non-transitory machine-readable medium of claim 20, wherein the instructions, when accessed, result in the machine performing:
 transmitting the derived clock signal into a well casing.

22. The non-transitory machine-readable medium of claim 20, wherein the instructions, when accessed, result in the machine performing:
 adjusting the measured frequency equivalent according to a measured or inferred rate of penetration associated with a downhole drilling operation.

23. The non-transitory machine-readable medium of claim 20, wherein the frequency of the derived clock signal is related to the frequency of the surface clock signal by a factor of M/N, where M and N are integers.

\* \* \* \* \*